(12) United States Patent
Haneda

(10) Patent No.: US 11,897,539 B2
(45) Date of Patent: Feb. 13, 2024

(54) CIRCUIT DEVICE, PHYSICAL QUANTITY MEASUREMENT DEVICE, ELECTRONIC APPARATUS, AND VEHICLE

(71) Applicant: Seiko Epson Corporation, Tokyo (JP)

(72) Inventor: Hideo Haneda, Matsumoto (JP)

(73) Assignee: SEIKO EPSON CORPORATION

( * ) Notice: Subject to any disclaimer, the term of this patent is extended or adjusted under 35 U.S.C. 154(b) by 811 days.

(21) Appl. No.: 17/032,394

(22) Filed: Sep. 25, 2020

(65) Prior Publication Data

US 2021/0094614 A1 Apr. 1, 2021

(30) Foreign Application Priority Data

Sep. 27, 2019 (JP) .................................. 2019-176354

(51) Int. Cl.
*B62D 11/00* (2006.01)
*H03M 1/44* (2006.01)
(Continued)

(52) U.S. Cl.
CPC .......... *B62D 11/003* (2013.01); *G04F 10/005* (2013.01); *H03M 1/1235* (2013.01); *H03M 1/442* (2013.01)

(58) Field of Classification Search
CPC ... B62D 11/003; H03M 1/1235; H03M 1/442; G04F 10/005
(Continued)

(56) References Cited

U.S. PATENT DOCUMENTS 7,629,915 B2 * 12/2009 Lin .................. G04F 10/005
341/166
8,081,013 B1 * 12/2011 Zhang ................ G01R 25/08
331/25
(Continued)

FOREIGN PATENT DOCUMENTS

JP 2000-227483 A 8/2000
JP 2011-519529 A 7/2011
(Continued)

*Primary Examiner* — Khai M Nguyen
(74) *Attorney, Agent, or Firm* — Harness, Dickey & Pierce, P.L.C.

(57) ABSTRACT

The circuit device includes an integration period signal generation circuit, a polarity switching signal generation circuit, and first and second integration circuits. The integration period signal generation circuit generates a first integration period signal kept in an active state in the first integration period. The polarity switching signal generation circuit generates a first integration polarity switching signal making a transition at a timing synchronized with the reference clock signal in the first integration period, and a second integration polarity switching signal making a transition a predetermined clock count of the reference clock signal after the transition timing of the first integration polarity switching signal in the first integration period. The first integration circuit performs an integrating process in which an integration polarity is switched at the transition timing of the first integration polarity switching signal in the first integration period. The second integration circuit performs an integrating process in which an integration polarity is switched at the transition timing of the second integration polarity switching signal in the first integration period.

10 Claims, 20 Drawing Sheets

(51) Int. Cl.
   *H03M 1/12*     (2006.01)
   *G04F 10/00*    (2006.01)
(58) Field of Classification Search
   USPC .......................................................... 341/166
   See application file for complete search history.

(56) References Cited

U.S. PATENT DOCUMENTS

2009/0256601 A1   10/2009   Zhang et al.
2015/0145572 A1    5/2015   Sato

FOREIGN PATENT DOCUMENTS

| | | |
|---|---|---|
| JP | 2015-128275 A | 7/2015 |
| JP | 2018-132460 A | 8/2018 |
| JP | 2018-132461 A | 8/2018 |

* cited by examiner

CIRCUIT DEVICE, PHYSICAL QUANTITY MEASUREMENT DEVICE, ELECTRONIC APPARATUS, AND VEHICLE

The present application is based on, and claims priority from JP Application Serial Number 2019-176354, filed Sep. 27, 2019, the disclosure of which is hereby incorporated by reference herein in its entirety.

BACKGROUND

1. Technical Field

The present disclosure relates to a circuit device, a physical quantity measurement device, an electronic apparatus, a vehicle, and so on.

2. Related Art

There is known a time digital conversion circuit which detects a phase difference between a first signal and a reference clock signal and a phase difference between a second signal and the reference clock signal to convert a time difference in transition timing between the first signal and the second signal into a digital value based on these phase differences. Related art of such a time digital conversion circuit is disclosed in JP-A-2018-132460 (Document 1). The time digital conversion circuit in Document 1 includes a pulse signal generation section and an integration processing section. The pulse signal generation section generates a pulse signal with a pulse width corresponding to a pulse width of the reference clock signal based on the first signal. The pulse signal becomes active when the first signal makes the transition. The integration processing section performs an integrating process in which the integration polarity is switched at a transition timing of the reference clock signal in an integration period in which the pulse signal is active. A result of the integrating process represents the phase difference between the first signal and the reference clock signal.

In the time digital conversion circuit of such a phase difference detection type as described above, the start timing of the integration period is determined by the transition timing of the first signal, and the switching timing of the integration polarity is determined by the transition timing of the reference clock signal. Since the transition timings of the first signal and the reference clock signal are arbitrary, the start or stop timing of the integration period and the switching timing of the integration polarity come close to each other in some cases. In such a case, since the integration in one of the positive and negative polarities is performed for a short time, there is a possibility that the integrating process fails to accurately be performed to cause a measurement error.

SUMMARY

An aspect of the present disclosure relates to a circuit device including an integration period signal generation circuit configured to generate a first integration period signal which turns to an active state at a transition of a first signal, and is kept in the active state in a first integration period having a predetermined period length longer than a period of a reference clock signal, a polarity switching signal generation circuit configured to generate a first integration polarity switching signal making a transition of a voltage level at a timing synchronized with the reference clock signal in the first integration period, and a second integration polarity switching signal making a transition of a voltage level a predetermined clock count of the reference clock signal after a transition timing of the first integration polarity switching signal in the first integration period, a first integration circuit configured to perform a first integrating process in which an integration polarity is switched at a transition timing of the first integration polarity switching signal in the first integration period, and a second integration circuit configured to perform a second integrating process in which an integration polarity is switched at a transition timing of the second integration polarity switching signal in the first integration period.

DESCRIPTION OF AN EXEMPLARY EMBODIMENT

Hereinafter, a preferred embodiment of the present disclosure will be described in detail. It should be noted that the embodiment described hereinafter does not unreasonably limit the content of the present disclosure as set forth in the appended claims, and all of the constituents described in the present embodiment are not necessarily essential constituents.

1. First Configuration Example

Figure 1:
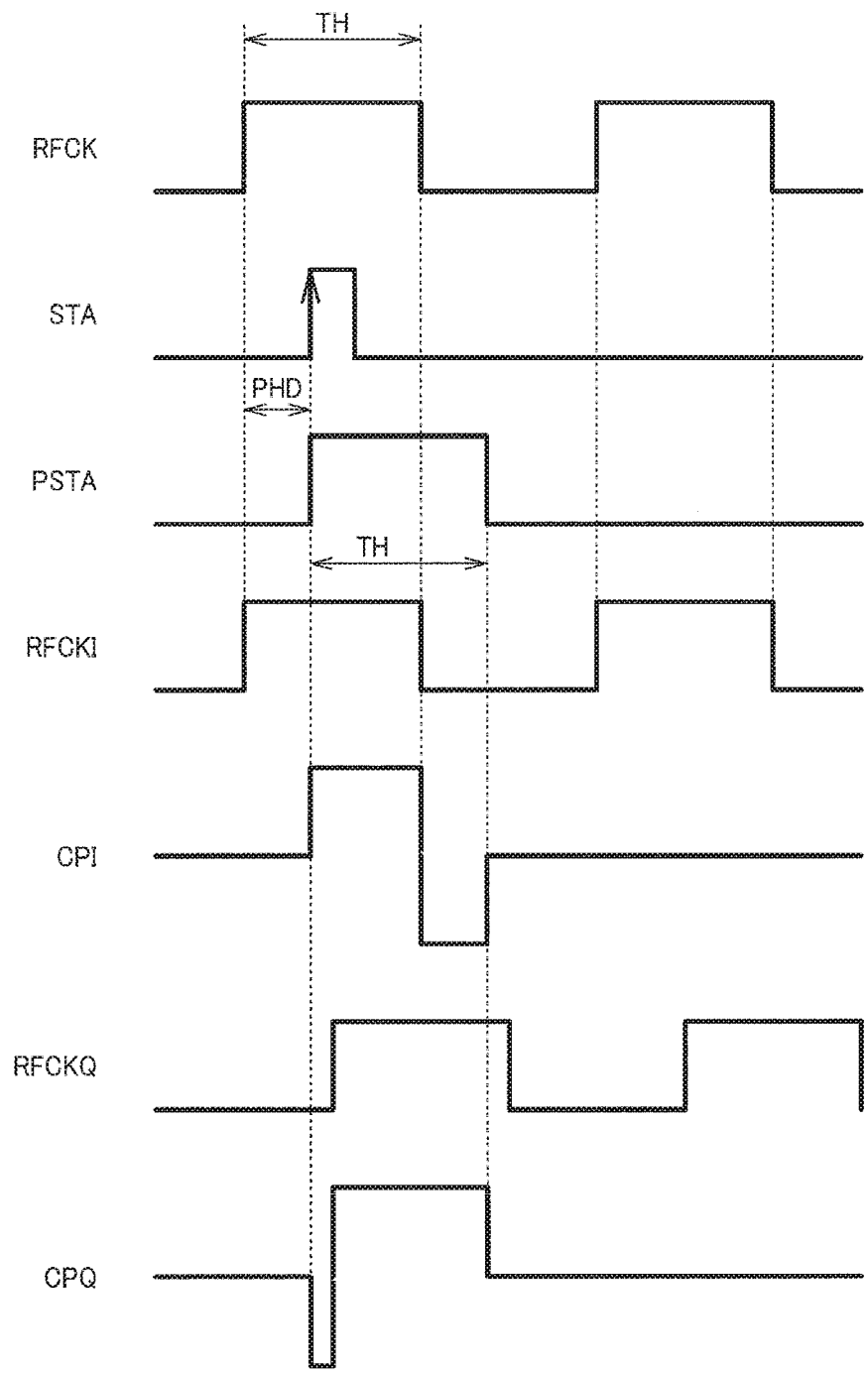
FIG. 1 is a waveform chart for explaining a method of performing an integrating process using a pulse signal generated from a first signal and a reference clock signal.

Firstly, a problem in a related-art time digital conversion circuit will be described. FIG. 1 is a waveform chart for explaining an operation of the time digital conversion circuit according to the related art.

In FIG. 1, there is shown a waveform chart when the time digital conversion circuit obtains a time difference in transition timing between a reference clock signal RFCK and a first signal STA. The time digital conversion circuit detects the time difference described above as a phase PHD of the first signal STA. When the time digital conversion circuit obtains a time difference between the first signal STA and a second signal, the time digital conversion circuit similarly obtains the phase with respect to the second signal. Then, the time digital conversion circuit obtains the time difference between the first signal STA and the second signal from the phase PHD of the first signal STA and the phase of the second signal. In FIG. 1, an operation of obtaining the phase PHD of the first signal STA will be described.

As shown in FIG. 1, the time digital conversion circuit changes a pulse signal PSTA from a low level to a high level at a rising edge of the first signal STA. The time digital conversion circuit changes the pulse signal PSTA from the high level to the low level after the same time as a pulse width TH of the reference clock signal RFCK elapses. This pulse signal is a signal for determining the integration period.

The time digital conversion circuit generates a clock signal RFCKI and a clock signal RFCKQ for switching the integration polarity. The phase of the clock signal RFCKI is the same as the phase of the reference clock signal RFCK, and the phase of the clock signal RFCKQ is lagged as much as 90 degrees from the phase of the reference clock signal RFCK.

The time digital conversion circuit performs a first integrating process using the pulse signal PSTA and the clock signal RFCKI, and a second integrating process using the pulse signal PSTA and the clock signal RFCKQ. The time digital conversion circuit generates a positive current or a negative current using a charge pump circuit, and then integrates the current to thereby obtain an integration value. Specifically, in the first integrating process, in a period in which the pulse signal PSTA is in the high level, the charge pump circuit outputs a positive current as a current CPI when the clock signal RFCKI is in the high level, or outputs a negative current as the current CPI when the clock signal RFCKI is in the low level. The time digital conversion circuit integrates the current CPI to thereby obtain the integration value PHI. In the second integrating process, in a period in which the pulse signal PSTA is in the high level, the charge pump circuit outputs a positive current as a current CPQ when the clock signal RFCKQ is in the high level, or outputs a negative current as the current CPQ when the clock signal RFCKQ is in the low level. The time digital conversion circuit integrates the current CPQ to thereby obtain the integration value PHQ.

Figure 2:
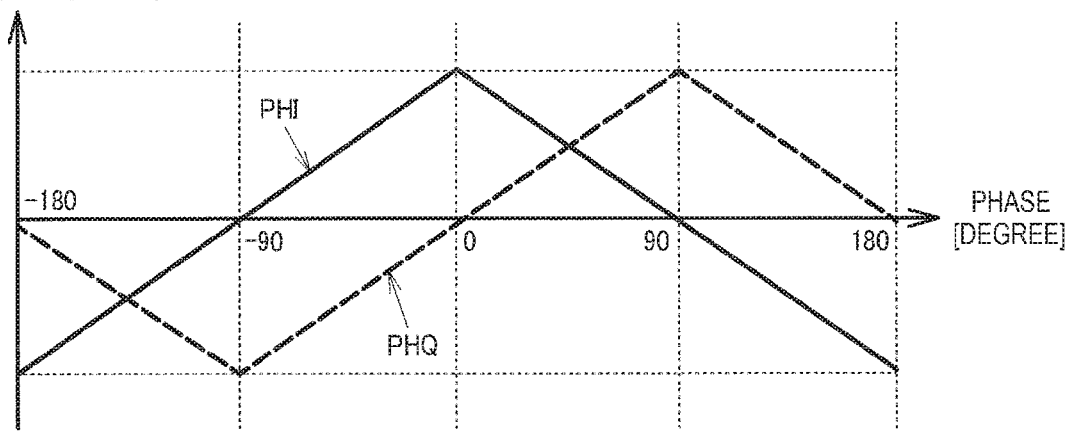
FIG. 2 is a characteristic diagram showing a relationship between a phase and integration values in the method shown in FIG. 1.

The time digital conversion circuit obtains the phase PHD of the rising edge of the first signal STA with respect to the rising edge of the reference clock signal RFCK based on the integration values PHI, PHQ. FIG. 2 is a characteristic diagram showing a relationship between the phase PHD and the integration values PHI, PHQ. The rising edge of the reference clock signal RFCK is defined as 0 degree in phase, and one cycle of the reference clock signal RFCK is defined as 360 degrees in phase. As shown in FIG. 2, the integration value PHI shows a pseudo-cosine wave, and the integration value PHQ shows a pseudo-sine wave. Therefore, the phase PHD is determined by the integration values PHI, PHQ.

Figure 3:
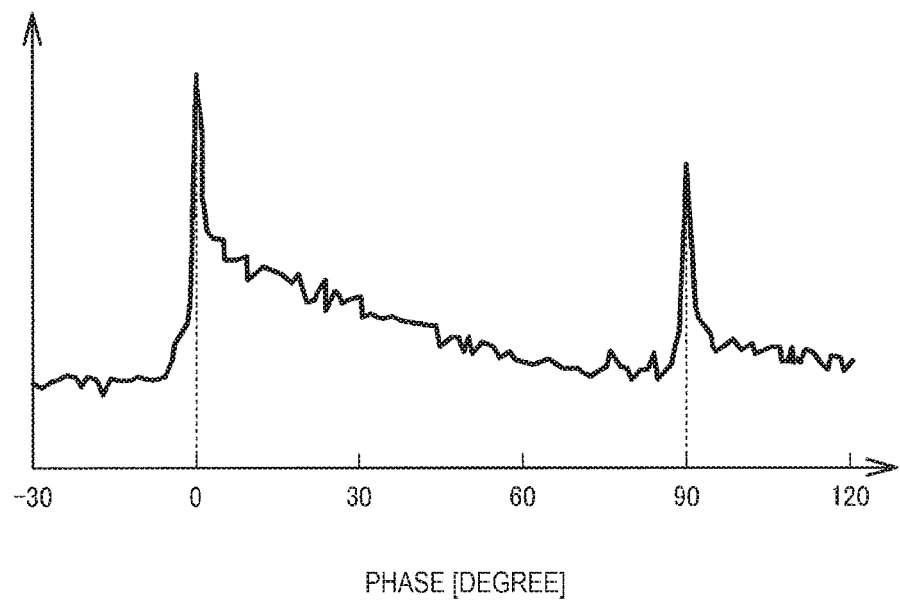
FIG. 3 is a characteristic diagram for explaining a measurement error in the method shown in FIG. 1.

FIG. 3 is a characteristic diagram for explaining a measurement error in the method described above. According to the characteristic diagram shown in FIG. 2, |PHI|+|PHQ| becomes constant irrespective of the phase PHD. However, as shown in FIG. 3, the error in the amplitude corresponding to |PHI|+|PHQ| is made large around 0 degree in phase and 90 degree in phase. This shows that the measurement accuracy has decreased in at least one of the integration values PHI and PHQ.

For example, in the waveform chart shown in FIG. 1, a rising edge of the clock signal RFCKQ exists immediately behind a rising edge of the first signal STA. Therefore, the period for which the charge pump circuit outputs a negative current as the current CPQ is made short. Since there is a possibility that such a narrow pulse, for example, vanishes or fails to appropriately be integrated, there is a possibility that the error in the integration value PHQ increases due to generation of the narrow pulse.

In the method shown in FIG. 1, the integration period in which the pulse signal PSTA is in the high level is determined by the transition timing of the first signal STA. Further, the switching timing of the integration polarity is determined by the transition timings of the clock signals RFCKI, RFCKQ based on the reference clock signal RFCK. Since when the first signal STA is input is unpredictable, it is not possible to control the relationship in transition timing between the first signal STA and the reference clock signal RFCK. Therefore, such a narrow pulse as described above occurs in some cases, and there is a possibility that the narrow pulse causes the measurement error in some cases.

Figure 4:
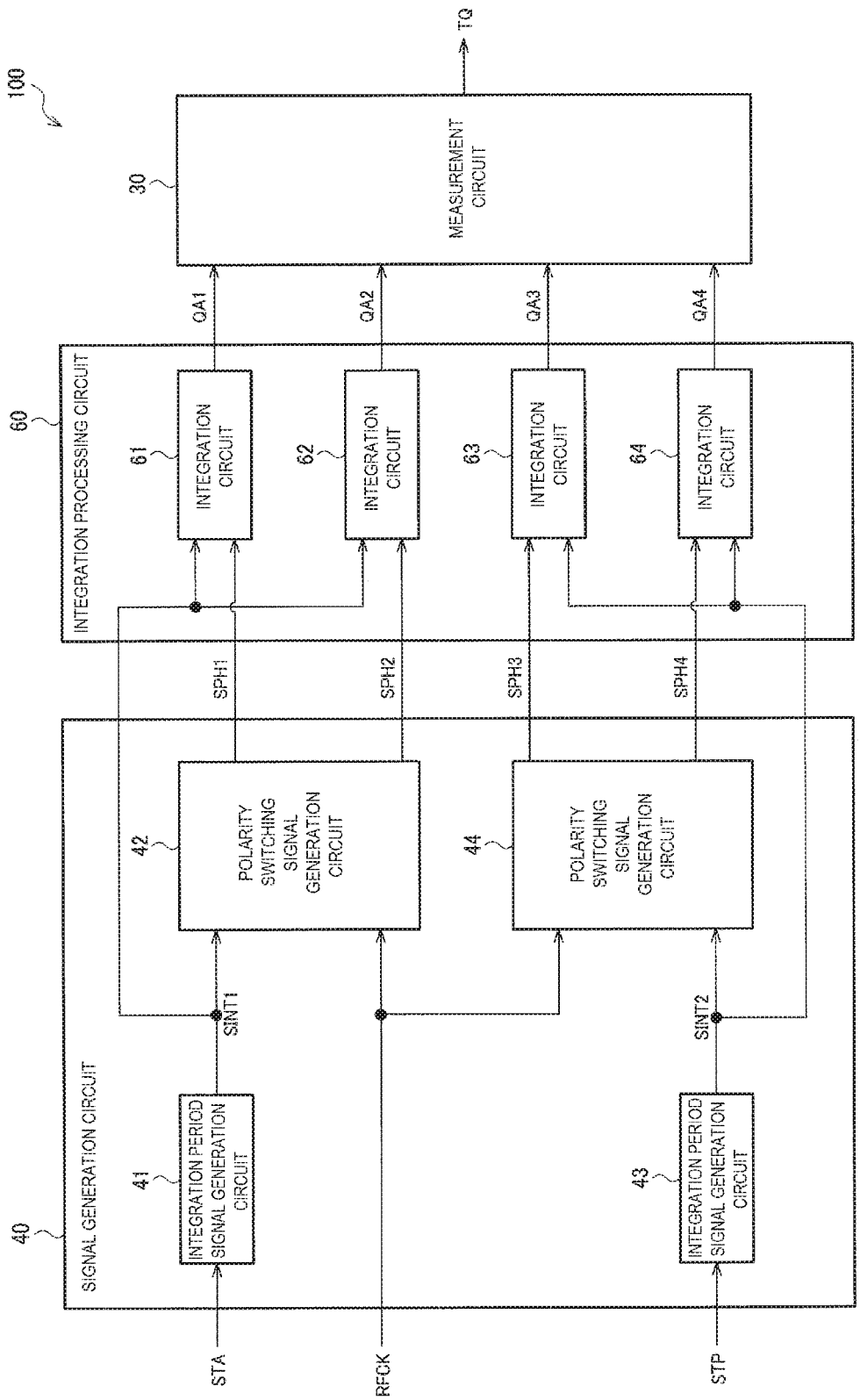
FIG. 4 is a diagram showing a first configuration example of a circuit device.

FIG. 4 shows a first configuration example of a circuit device 100 according to the present embodiment. The circuit device 100 includes a signal generation circuit 40, an integration processing circuit 60, and a measurement circuit 30. The circuit device 100 is an integrated circuit device called an IC (Integrated Circuit). For example, the circuit device 100 is an IC manufactured using a semiconductor process, and a semiconductor chip having circuit elements formed on a semiconductor substrate.

The signal generation circuit 40 generates a signal for the integrating process based on the first signal STA, the second signal STP, and the reference clock signal RFCK. The signal generation circuit 40 includes an integration period signal generation circuit 41 as a first integration period signal generation circuit, a polarity switching signal generation circuit 42 as a first polarity switching signal generation circuit, an integration period signal generation circuit 43 as a second integration period signal generation circuit, and a polarity switching signal generation circuit 44 as a second polarity switching signal generation circuit.

The integration period signal generation circuit 41 generates a signal SINT1 as a first integration period signal based on the first signal STA. The polarity switching signal generation circuit 42 generates a signal SPH1 as a first integration polarity switching signal and a signal SPH2 as a second integration polarity switching signal based on the signal SINT1 and the reference clock signal RFCK. The integration period signal generation circuit 43 generates a signal SINT2 as a second integration period signal based on the second signal STP. The polarity switching signal generation circuit 44 generates a signal SPH3 as a third integration polarity switching signal and a signal SPH4 as a fourth integration polarity switching signal based on the signal SINT2 and the reference clock signal RFCK.

The integration processing circuit 60 performs the integrating process based on the signals SINT1, SPH1, SPH2, SINT2, SPH3, and SPH4 to thereby output voltages QA1 through QA4 as first through fourth integration values. The voltages QA1, QA2 represent a phase corresponding to the time difference in transition timing between the first signal STA and the reference clock signal RFCK. The voltages QA3, QA4 represent a phase corresponding to a time difference in transition timing between the second signal STP and the reference clock signal RFCK. The integration processing circuit 60 includes an integration circuit 61 as a first integration circuit, an integration circuit 62 as a second integration circuit, an integration circuit 63 as a third integration circuit, and an integration circuit 64 as a fourth integration circuit.

The integration circuit 61 performs the first integrating process based on the signals SINT1, SPH1 to output the voltage QA1. The integration circuit 62 performs the second integrating process based on the signals SINT1, SPH2 to output the voltage QA2. The integration circuit 63 performs a third integrating process based on the signals SINT2, SPH3 to output the voltage QA3. The integration circuit 64 performs a fourth integrating process based on the signals SINT2, SPH4 to output the voltage QA4.

The measurement circuit 30 outputs a digital value TQ representing the time difference in transition timing between the first signal STA and the second signal STP based on the voltages QA1 through QA4. Specifically, the measurement circuit 30 performs the A/D conversion on each of the voltages QA1 through QA4 to calculate the digital value TQ from the A/D conversion values thereof.

Figure 5:
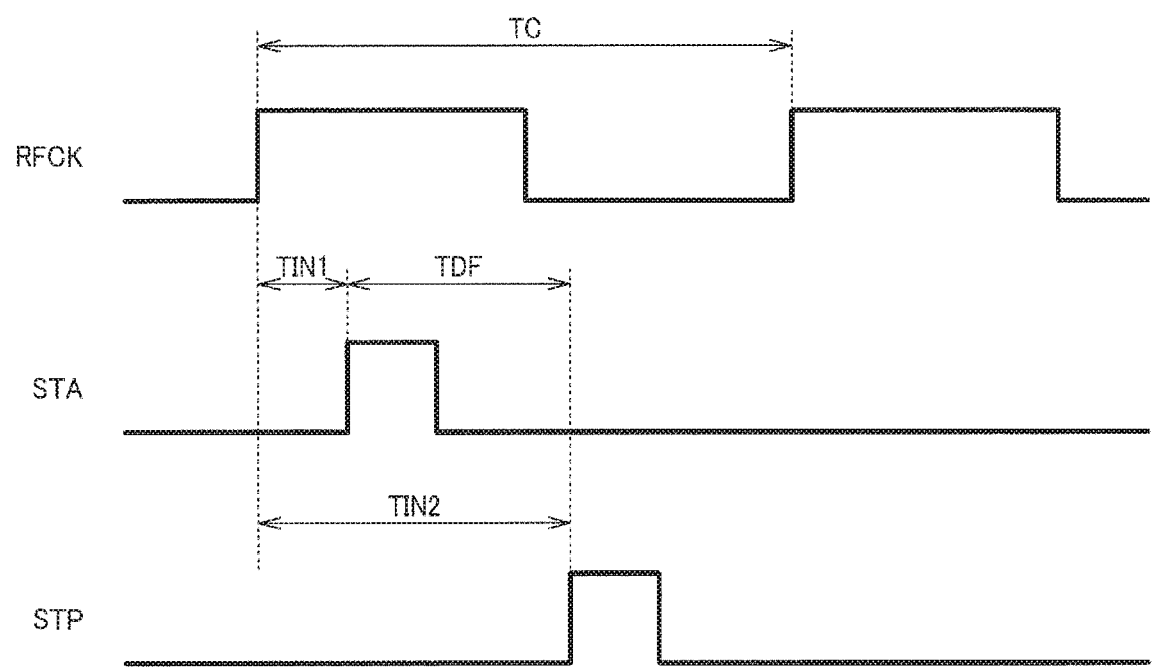
FIG. 5 is a waveform chart for explaining a method of a time measurement.

FIG. 5 is a waveform chart for explaining a method of the time measurement. A reference TIN1 represents the time difference in transition timing between the reference clock signal RFCK and the first signal STA. A reference TIN2 represents the time difference in transition timing between the reference clock signal RFCK and the second signal STP. A reference TDF represents the time difference in transition timing between the first signal STA and the second signal STP. A reference TC represents the period of the reference clock signal RFCK.

The voltages QA1, QA2 output by the integration processing circuit 60 represent the phase corresponding to the time difference TIN1, and the voltages QA3, QA4 represent the phase corresponding to the time difference TIN2. The time difference TDF can be obtained as TDF=TIN2−TIN1 from these phases and the period TC as a known parameter. Based on this fact, it is possible for the measurement circuit 30 to obtain the digital value TQ representing the time difference TDF from the voltages QA1 through QA4. It should be noted that a detailed method of calculating the digital value TQ will be described later.

Regarding the first signal STA and the second signal STP, a variety of signals can be assumed. For example, the second signal STP makes the transition based on the transition of the first signal STA. The first signal STA is also called a start signal, and the second signal STP is also called a stop signal. For example, a physical quantity measurement device including the circuit device 100 generates the first signal STA, then emits a light pulse or an ultrasonic pulse at the transition timing of the first signal STA, and then receives the light pulse or the ultrasonic pulse reflected by a measurement target. The physical quantity measurement device generates the second signal STP making the transition at the transition timing of the light pulse or the ultrasonic pulse thus received. The physical quantity measurement device inputs the first signal STA and the second signal STP to the circuit device 100.

Alternatively, the transition of the first signal STA and the transition of the second signal STP can be independent of each other. On this occasion, the anteroposterior relationship in transition timing between the first signal STA and the second signal STP does not matter. In other words, the second signal STP can make the transition posterior to the transition of the first signal STA, or can also make the transition anterior to the transition of the first signal STA. It is possible to use the circuit device 100 as, for example, a phase comparator in a PLL circuit. A reference clock signal to be input to the phase comparator corresponds to the first signal STA, a frequency division signal to be fed back from a frequency divider corresponds to the second signal STP.

A detailed operation of the circuit device 100 will be described using FIG. 6 and FIG. 7. It should be noted that in FIG. 6 and FIG. 7, the description will be presented using the operation of obtaining the voltages QA1, QA2 representing the phase of the first signal STA as an example.

Figure 6:
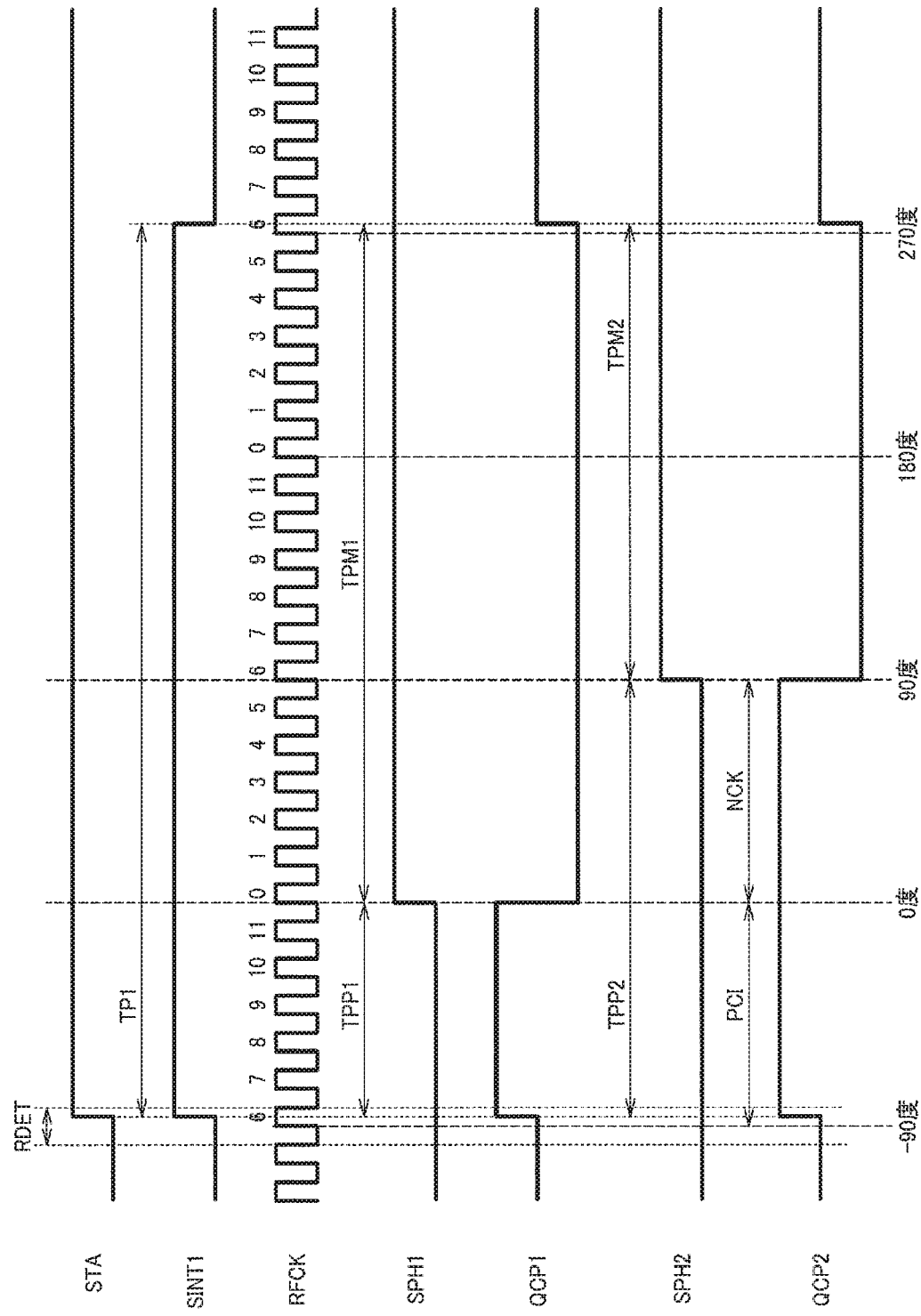
FIG. 6 is a waveform chart for explaining an operation of the circuit device as the first configuration example.

FIG. 6 is a waveform chart for explaining the operation of the circuit device 100. As shown in FIG. 6, the integration period signal generation circuit 41 makes the transition of the signal SINT1 from the inactive state to the active state at the transition timing of the first signal STA, keeps the signal SINT1 in the active state during the integration period TP1, and then makes the signal SINT1 inactive. It is assumed here that the active state corresponds to the high level, and the inactive state corresponds to the low level, but this is not a limitation. The transition timing is the timing at which a signal level changes, and corresponds to a rising edge or a falling edge of the signal. Hereinafter, it is assumed that the transition timing corresponds to a rising edge. The integration period TP1 corresponds to a first integration period, and the length of the integration period TP1 is longer than the period TC of the reference clock signal RFCK. As described later, the length of the integration period TP1 is more than quadruple of the period TC.

A detection range RDET of the phase of the first signal STA corresponds to one cycle of the reference clock signal RFCK. The first signal STA is input to the circuit device 100 at an arbitrary timing. Therefore, when the first signal STA makes the transition, the period of the reference clock signal RFCK to which the transition timing belongs becomes the detection range RDET. A period between the falling edges of the reference clock signal RFCK is defined as the detection range RDET in FIG. 6, but it is possible to define a period between the rising edges of the reference clock signal RFCK as the detection range RDET.

The polarity switching signal generation circuit 42 makes the transition of the signal SPH1 from the low level to the high level at a timing synchronized with the reference clock signal RFCK in the integration period TP1. The transition timing of the signal SPH1 is synchronized with a rising edge of the reference clock signal RFCK a clock count PCI after the rising edge of the reference clock signal RFCK in the detection range RDET. For example, the circuit device 100 has a register not shown, and the polarity switching signal generation circuit 42 controls the transition timing of the signal SPH1 based on the clock count PCI stored in the register. In the example shown in FIG. 6, PCI=6 is assumed.

It is assumed that the transition timing of the signal SPH1 is a reference of the phase, namely 0 degree. This corresponds to an assumption that the phase of the first signal STA is assumed as 0 degree when the transition timing of the first signal STA coincides with the rising edge of the reference clock signal RFCK. In the example shown in FIG. 6, the length of the integration period TP1 corresponds to 24 cycles of the reference clock signal RFCK. When assuming the integration period TP1 as 360 degrees in phase, one cycle of the reference clock signal RFCK corresponds to 15 degrees in phase. The pulses of the reference clock signal RFCK shown in FIG. 6 are numbered assuming the transition timing of the signal SPH1 as the reference "0," and when the number is different as much as 1, the phase is different as much as 15 degrees. It should be noted that although the length of the integration period TP1 is an integral multiple of the period TC of the reference clock signal RFCK in FIG. 6, it is sufficient for the length of the integration period TP1 to be a value obtained by multiplying the period TC by a real number no smaller than 4.

The polarity switching signal generation circuit 42 makes the transition of the signal SPH2 from the low level to the high level a clock count NCK of the reference clock signal RFCK after the transition timing of the signal SPH1 in the integration period TP1. In the example shown in FIG. 6, NCK=6 is true, and the signal SPH1 and the signal SPH2 are different in phase as much as 90 degrees. This corresponds to the fact that two integration values shifted in phase as much as 90 degrees can be obtained as shown in FIG. 7. As described later, by using these two integration values, it is possible to determine the phase of the first signal STA even when the integration period TP1 is unknown.

The integration circuit 61 performs the first integrating process in which the integration polarity is switched at the transition timing of the signal SPH1 in the integration period TP1. The integration period TP1 is zoned by the transition timing of the signal SPH1 into a period TPP1 and a period TPM1. The period TPP1 is a first anterior half period, and the period TPM1 is a first posterior half period. The integration circuit 61 performs the first integrating process in a first polarity in the period TPP1, and performs the first integrating process in a second polarity as an opposite polarity to the first polarity in the period TPM1. Here, the first polarity is defined as a positive polarity, and the second polarity as a negative polarity, but this is not a limitation. As described later with reference to FIG. 20, the integration circuit 61 includes a current generation section and an integration section. The current generation section outputs a positive current as a current QCP1 in the period TPP1, and outputs a negative current as the current QCP1 in the period TPM1. The integration section performs a current-voltage conversion on the current QCP1 and at the same time integrates the current QCP1, and then outputs the voltage QA1 as the integration result.

The integration circuit 62 performs the second integrating process in which the integration polarity is switched at the transition timing of the signal SPH2 in the integration period TP1. The integration period TP1 is zoned by the transition timing of the signal SPH2 into a period TPP2 and a period TPM2. The period TPP2 is a second anterior half period, and the period TPM2 is a second posterior half period. The integration circuit 62 performs the second integrating process in the positive polarity in the period TPP2, and performs the second integrating process in the negative polarity in the period TPM2. The integration circuit 62 includes a current generation section and an integration section. The current generation section outputs a positive current as a current QCP2 in the period TPP2, and outputs a negative current as the current QCP2 in the period TPM2. The integration section performs a current-voltage conversion on the current QCP2 and at the same time integrates the current QCP2, and then outputs the voltage QA2 as the integration result.

Figure 7:
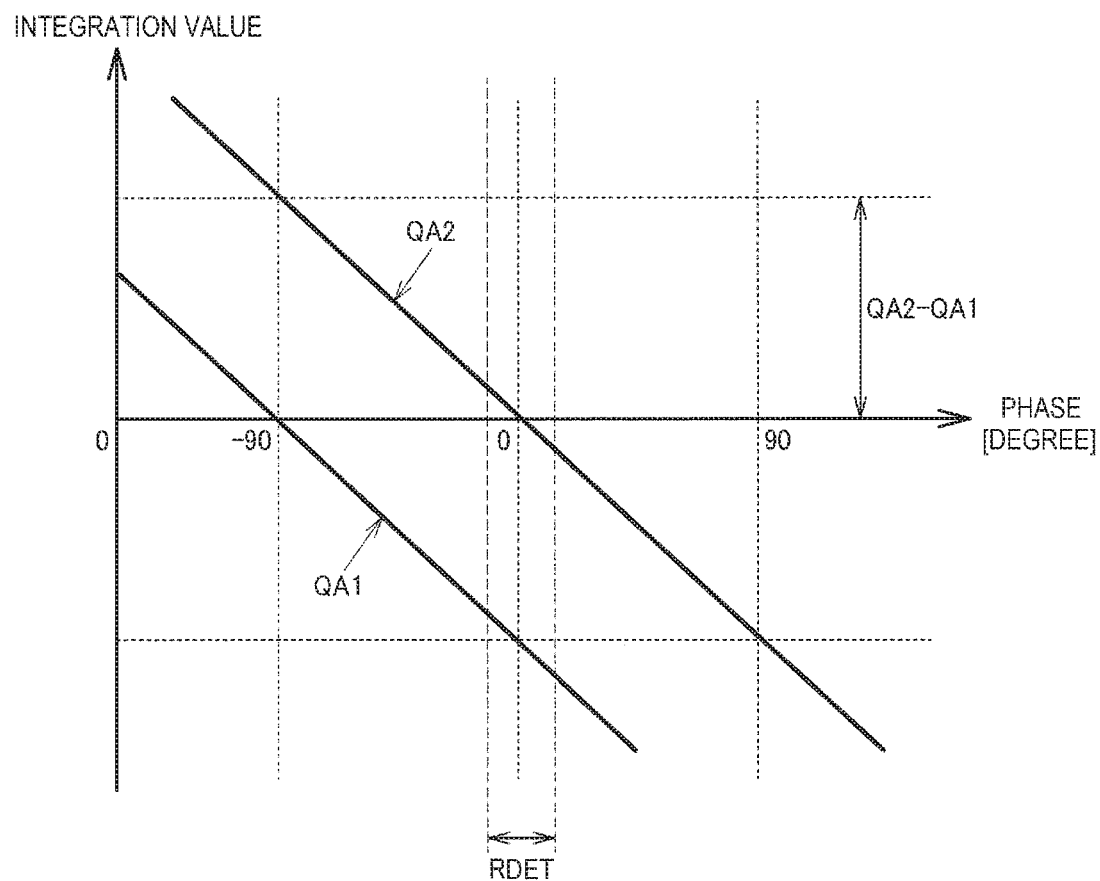
FIG. 7 is a characteristic diagram showing a relationship between a phase of the first signal and integration values.

FIG. 7 is a characteristic diagram showing a relationship between the phase of the first signal STA and the integration values. As shown in FIG. 7, the voltages QA1, QA2 representing the integration values each have a linear characteristic with respect to the phase. Further, the amplitude of the integration values is expressed as $|QA1|+|QA2|=QA2-QA1$, and is constant with respect to the phase. The voltage QA2 has a characteristic in which the phase is shifted as much as 90 degrees with respect to the voltage QA1. The detection range RDET of the phase is a range of 15 degrees centering on 0 degree in phase. Although the characteristics of the voltages QA1, QA2 are described outside the detection range RDET in FIG. 7, the voltages QA1, QA2 actually output by the integration processing circuit 60 each take a value within the detection range RDET as a result.

It should be noted that the voltages QA3, QA4 are also generated in substantially the same manner as described above. In other words, the integration period signal generation circuit 43 makes the transition of the signal SINT2 from the inactive state to the active state at the transition timing of the second signal STP. The period in which the signal SINT2 is in the active state corresponds to the second integration period, and the length of the period is longer than the period TC of the reference clock signal RFCK. The length of the second integration period is more than quadruple of the period TC.

Similarly to the detection range RDET of the phase of the first signal STA, a detection range of the phase of the second signal STP corresponds to one cycle of the reference clock signal RFCK.

The polarity switching signal generation circuit 44 makes the transition of the signal SPH3 from the low level to the high level at a timing synchronized with the reference clock signal RFCK in the second integration period. The transition timing of the signal SPH3 is synchronized with a rising edge of the reference clock signal RFCK the clock count PCI after the rising edge of the reference clock signal RFCK in the detection range.

The polarity switching signal generation circuit 44 makes the transition of the signal SPH4 from the low level to the high level the clock count NCK of the reference clock signal RFCK after the transition timing of the signal SPH3 in the second integration period.

The integration circuit 63 performs the third integrating process in which the integration polarity is switched at the transition timing of the signal SPH3 in the second integration period. The second integration period is zoned by the transition timing of the signal SPH3 into a third anterior half period and a third posterior half period. The integration circuit 63 performs the third integrating process in the first polarity in the third anterior half period, and performs the third integrating process in the second polarity in the third posterior half period. The integration circuit 63 outputs the voltage QA3 as the integration result.

The integration circuit 64 performs the fourth integrating process in which the integration polarity is switched at the transition timing of the signal SPH4 in the second integration period. The second integration period is zoned by the transition timing of the signal SPH4 into a forth anterior half period and a fourth posterior half period. The integration circuit 64 performs the fourth integrating process in the positive polarity in the fourth anterior half period, and performs the fourth integrating process in the negative polarity in the fourth posterior half period. The integration circuit 64 outputs the voltage QA4 as the integration result.

The voltages QA3, QA4 representing the integration values each have a linear characteristic with respect to the phase. Further, the amplitude of the integration values is expressed as |QA3|+|QA4|=QA4−QA3, and is constant with respect to the phase.

The voltage QA4 has a characteristic in which the phase is shifted as much as 90 degrees with respect to the voltage QA3. The detection range of the phase is a range of 15 degrees centering on 0 degree in phase.

In the method described with reference to FIG. 1 through FIG. 3, the integration values PHI, PHQ are not linear with respect to the phase as shown in FIG. 2. Specifically, the integration value PHI is folded back at 0 degree in phase, and the integration value PHQ is folded back at −90 degree and +90 degree in phase. In the vicinity of the phase at which such folding back occurs, the narrow pulse occurs as described with reference to FIG. 1, and therefore, an error occurs in the time measurement as described with reference to FIG. 3. This is caused by the fact that the reference clock signal RFCK is used for switching the integration polarity. Specifically, the time digital conversion circuit cannot control the transition timing of the reference clock signal RFCK, and therefore, cannot control the switching timing of the integration polarity in the integration period. Therefore, there occurs the narrow pulse short in the period of the positive integration or the negative integration.

According to the present embodiment, as described with reference to FIG. 4 and FIG. 6, the polarity switching signal generation circuit 42 generates the signals SPH1, SPH2, the integration circuit 61 switches the integration polarity at the transition timing of the signal SPH1, and the integration circuit 62 switches the integration polarity at the transition timing of the signal SPH2. In other words, since the polarity switching signal generation circuit 42 controls the switching timing of the integration polarity, it is possible to switch the integration polarity at an appropriate timing in the integration period TP1. Thus, since the periods for the positive integration and the negative integration are appropriately ensured, and therefore, the narrow pulse does not occur in the integrating process, the error in the time measurement is reduced.

In the present embodiment, as described with reference to FIG. 7, the integration value is linear with respect to the phase, and the folding back does not occur. This is because the polarity switching signal generation circuit 42 generates the signals SPH1, SPH2. In other words, as shown in FIG. 6, the integration is started inevitably in the positive polarity in the integration period, the switching to the integration in the negative polarity occurs, and process terminates with the integration in the negative polarity. When the phase changes, the ratio in period between the positive polarity and the negative polarity changes linearly, and therefore, the integration result becomes to have a linear characteristic. In such an integration value in which the folding back does not occur, only the detection range RDET in the vicinity of 0 degree in phase is used, and therefore, it becomes possible to avoid the occurrence of the narrow pulse. Further, since the integration value is linear, the phase is uniquely determined from the integration value, and therefore, the calculation for obtaining the digital value of the time difference from the integration value is simplified.

Figure 8:
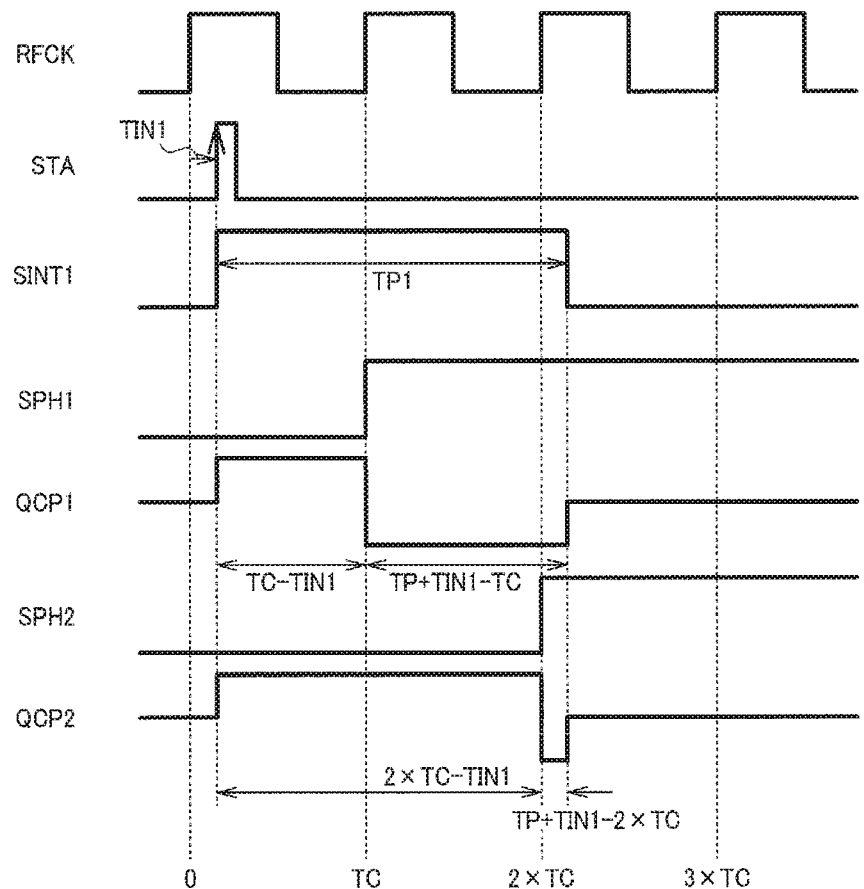
FIG. 8 is a waveform chart for explaining a method of obtaining a digital value of a time difference from the integration value.

FIG. 8 is a waveform chart for explaining a method of obtaining the digital value of the time difference from the integration value. Here, the integration period defined by the signal SINT1 is denoted by TP1. Further, although the length of the integration period TP1 is assumed as 2XTC, it is desirable for the length of the integration period TP1 to be no shorter than 4XTC. The reference TC represents the period of the reference clock signal RFCK.

As shown in the following formula (1), the voltage obtained by integrating the current I0 in the capacitor with the capacitance C0 in the integration period TP1 corresponding to 2XTC is denoted by AZ1.

$$AZ1 = (I0/C0) \times (2 \times TC) \quad (1)$$

Figure 9:
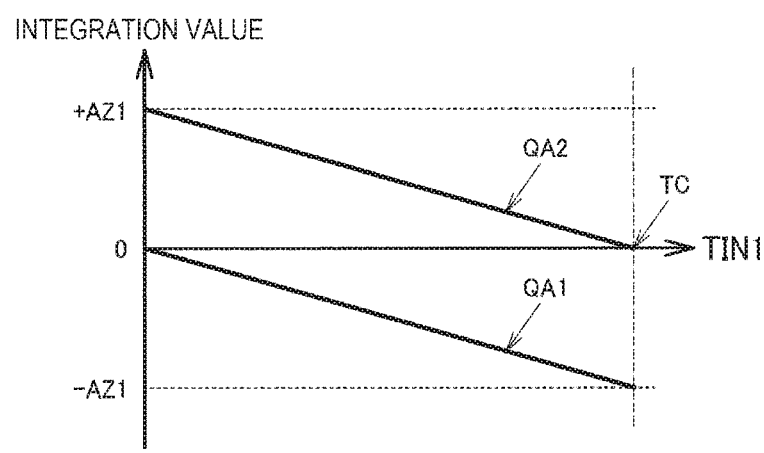
FIG. 9 is a characteristic diagram showing a relationship between a time difference in transition timing between the first signal and the reference clock signal, and voltages output by integration circuits.

FIG. 9 is a characteristic diagram showing a relationship between the time difference TIN1 in transition timing between the first signal STA and the reference clock signal RFCK, and the voltages QA1, QA2 output by the integration circuits 61, 62.

According to FIG. 8, the voltages QA1, QA2 are expressed as the following formulas (2), (3). The formula (1) described above is used in the formula deformation.

$$QA1 = (I0/C0) \times \{(TC - TIN1) - (TP1 + TIN1 - TC)\} \quad (2)$$
$$= AZ1 \times \{1 - TP1/2 \times TC) - TIN1/TC\}$$

$$QA2 = (I0/C0) \times \{(2 \times TC - TIN1) - (TP1 + TIN1 - 2 \times TC)\} \quad (3)$$
$$= AZ1 \times \{2 - TP1/(2 \times TC) - TIN1/TC\}$$

The following formula (4) is obtained from the formulas (2), (3) described above.

$$QA2 - QA1 = AZ1 \quad (4)$$

In the similar manner, the following formulas (5) through (7) can be obtained with respect to the voltages QA3, QA4 output by the integration circuits 63, 64.

$$QA3 = AZ2 \times \{1 - TP1/(2 \times TC) - TIN2/TC\} \quad (5)$$

$$QA4 = AZ2 \times \{2 - TP2/(2 \times TC) - TIN2/TC\} \quad (6)$$

$$QA4 - QA3 = AZ2 \quad (7)$$

The reference TP2 represents the integration period defined by the signal SINT2. The reference TIN2 represents the time difference in transition timing between the second signal STP and the reference clock signal RFCK. The reference AZ2 represents the voltage obtained by integrating the current I0 in the capacitor with the capacitance C0 in the integration period TP2 corresponding to 2×TC.

The time difference TDF in transition timing between the first signal STA and the second signal STP is obtained as the following formula (8) using the formulas (2), (5) described above.

$$TDF = TIN2 - TIN1 \quad (8)$$
$$= TC \times (QA3/AZ2 - QA1/AZ1) + (TP2 - TP1)/2$$

In the formula (8) described above, the period TC of the reference clock signal RFCK is a known parameter, and the voltages AZ1, AZ2 are obtained from the formulas (4), (7) described above. Further, by setting TP2=TP1, the term (TP2−TP1)/2 vanishes.

Therefore, it is possible for the measurement circuit 30 to calculate the digital value TQ of the time difference TDF from the voltages QA1 through QA4 using the formula (8) described above. It should be noted that it is not required for the digital value TQ to be the time difference TDF itself. For example, it is possible for the measurement circuit 30 to output (QA3/AZ2−QA1/AZ1) in the formula (8) described above as the digital value TQ. In this case, it is also possible for an external device of the circuit device 100 to multiply the digital value TQ by the period TC to thereby obtain the time difference TDF.

Figure 10:
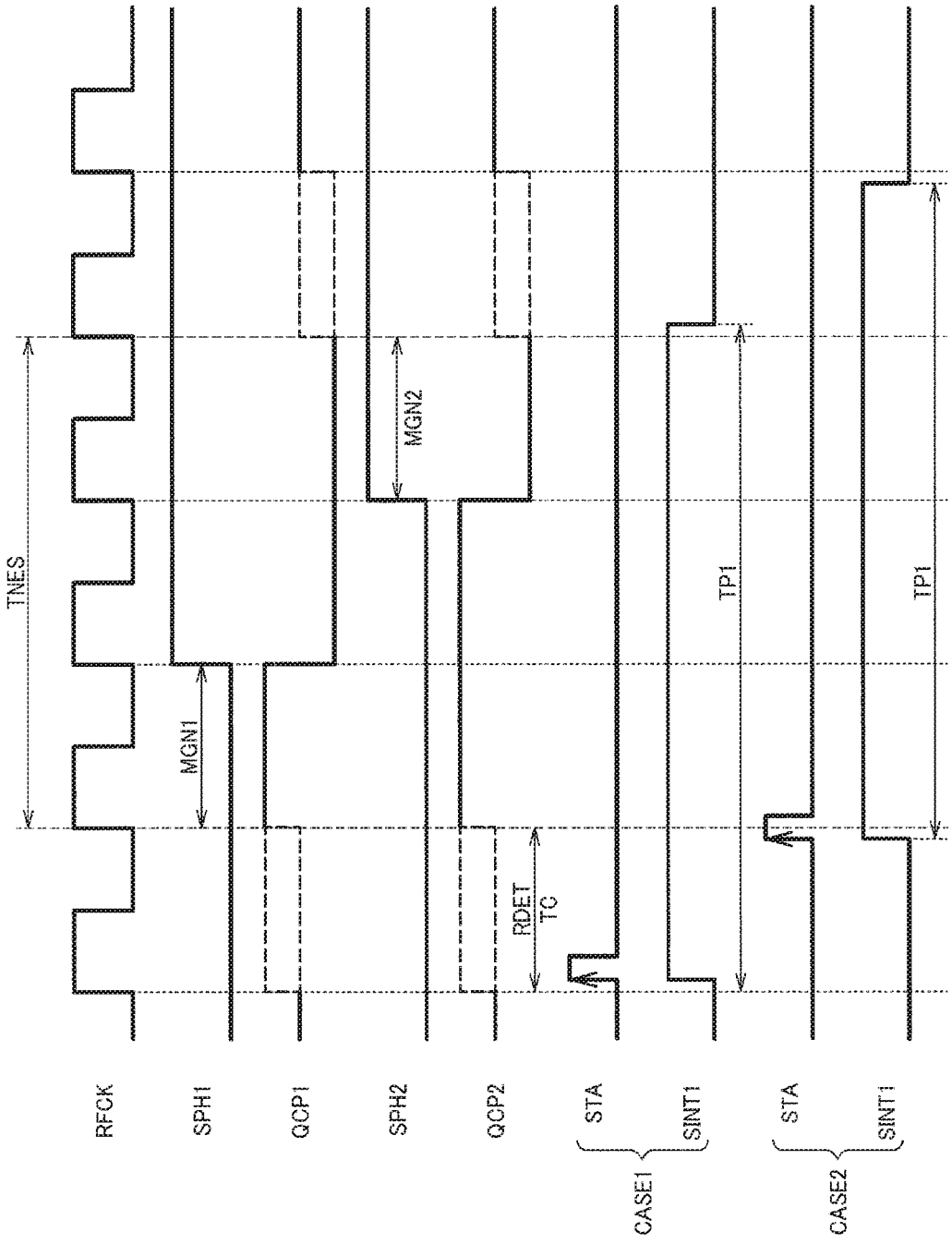
FIG. 10 is a waveform chart for explaining the fact that the integration period is no less than quadruple of the period of the reference clock signal.

FIG. 10 is a waveform chart for explaining the fact that the integration period is no less than quadruple of the period TC of the reference clock signal RFCK. Although in FIG. 10, the integration period TP1 defined by the signal SINT1 is described, the same applies to the integration period defined by the signal SINT2.

A case 1 is when the transition timing of the first signal STA is close to the rising edge of the reference clock signal RFCK on the anterior side in the detection range RDET. A case 2 is when the transition timing of the first signal STA is close to the rising edge of the reference clock signal RFCK on the posterior side in the detection range RDET. In either of the cases 1, 2, it is necessary to determine the length of the integration period TP1 so as not to generate the narrow pulse in which the period for the positive integration or the negative integration is short.

The length of the integration period TP1 is assumed as 4XTC. The length of a period TNES in which the integration period TP1 in the case 1 and the integration period TP2 in the case 2 overlap each other is 3XTC. The transition timing of the signal SPH1 for switching the integration polarity requires a margin MGN1 of at least 1XTC for the rising edge of the integration period TP1 in the case 2. The transition timing of the signal SPH2 for switching the integration polarity is required to be distant at least 1XTC with respect to the transition timing of the signal SPH1. Further, the transition timing of the signal SPH2 requires a margin MGN2 of at least 1XTC for the rising edge of the integration period TP1 in the case 1.

This shows the fact that 3XTC or longer is necessary as the length of the period TNES. Since the integration period TP1 in the case 1 and the integration period TP2 in the case 2 are shifted up to RDET=1XTC from each other, 4XTC or longer is necessary as the length of the integration period TP1.

2. Detailed Configuration Example

Figure 11:
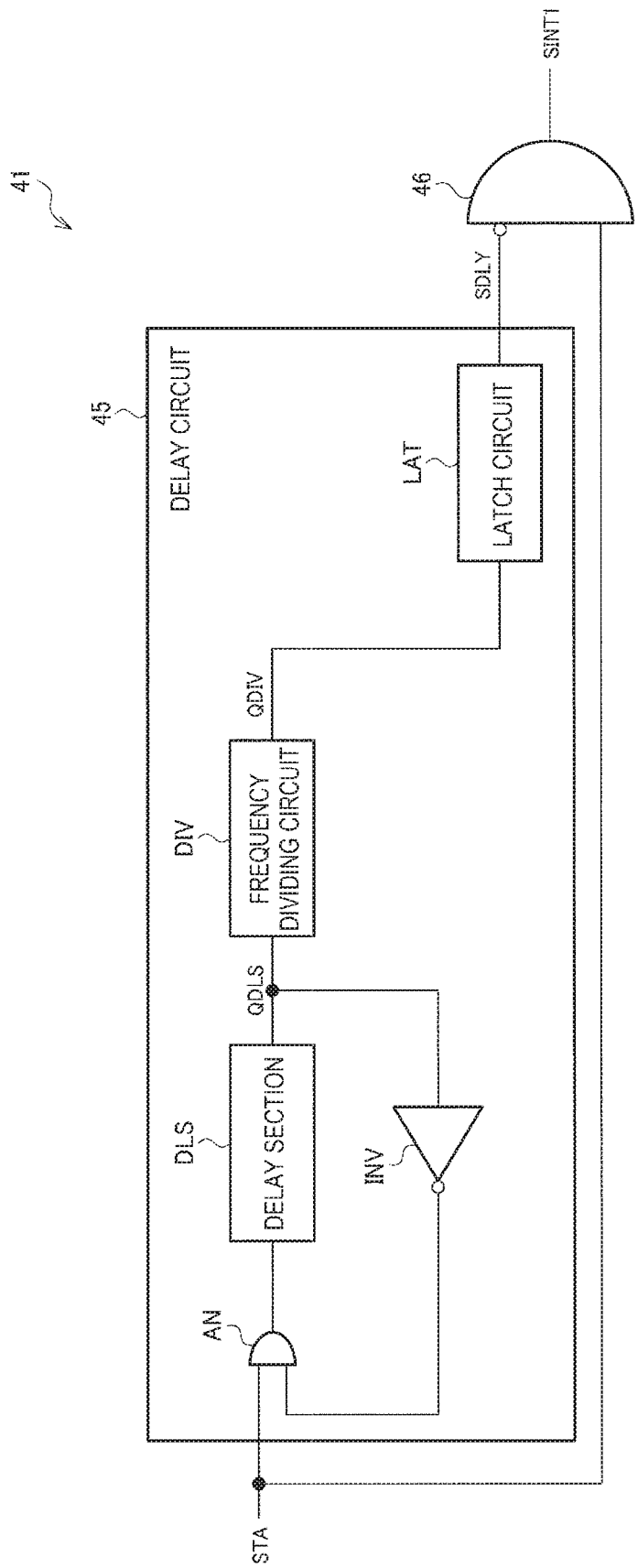
FIG. 11 is a diagram showing a detailed configuration example of an integration period signal generation circuit.

FIG. 11 shows a detailed configuration example of the integration period signal generation circuit. Here, although the description is presented citing the integration period signal generation circuit 41 as an example, the integration period signal generation circuit 43 also has substantially the same configuration. The integration period signal generation circuit 41 includes a delay circuit 45 and a signal output circuit 46.

The delay circuit 45 delays the first signal STA to thereby output a delay signal SDLY. The delay signal SDLY is a signal making the transition after a predetermined period elapses from the transition of the first signal STA. The delay circuit 45 includes an AND circuit AN, a delay section DLS, an inverter INV, a frequency dividing circuit DIV, and a latch circuit LAT.

A loop constituted by the AND circuit AN, the delay circuit DLS, and the inverter INV functions as an oscillation circuit to generate a clock signal QDLS. The frequency dividing circuit DIV divides the clock signal QDLS to output a frequency division clock signal QDIV. The latch circuit LAT performs a latch operation based on the frequency division clock signal QDIV to output the delay signal SDLY.

The signal output circuit 46 outputs the signal SINT1 based on the first signal STA and the delay signal SDLY. The signal output circuit 46 changes the signal SINT1 from a first voltage level to a second voltage level when the first signal STA makes the transition, and changes the signal SINT1 from the second voltage level to the first voltage level when the delay signal SDLY makes the transition. The signal output circuit 46 is an AND circuit to which a logical NOT signal of the delay signal SDLY and the first signal STA are input.

Figure 12:
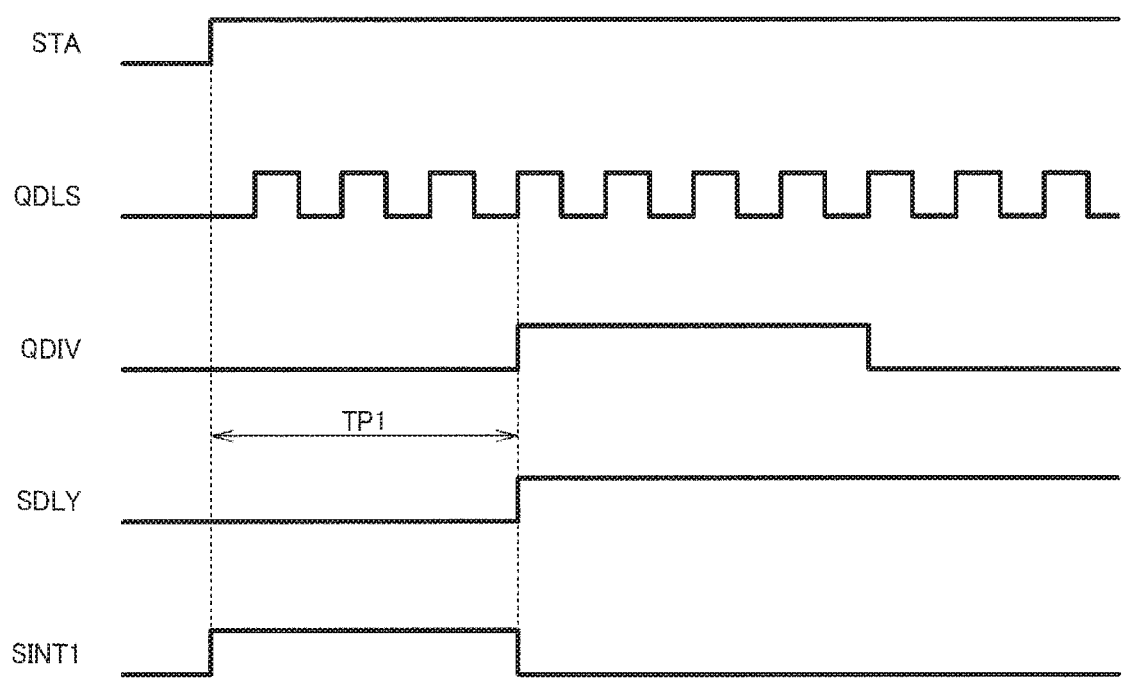
FIG. 12 is a waveform chart for explaining an operation of the integration period signal generation circuit.

FIG. 12 is a waveform chart for explaining the operation of the integration period signal generation circuit 41. When the first signal STA makes the transition from the low level to the high level, the oscillation circuit constituted by the AND circuit AN, the delay section DLS, and the inverter INV starts the oscillation to start to output the clock signal QDLS. In FIG. 12, the frequency division ratio of the frequency dividing circuit DIV is assumed as ¼. In this case, the frequency dividing circuit DIV makes the transition of the frequency division clock signal QDIV from the low level to the high level at the fourth rising edge of the clock signal QDIV. The latch circuit LAT latches the high level when the frequency division clock signal QDIV makes the transition from the low level to the high level to thereby make the transition of the delay signal SDLY from the low level to the high level.

The signal output circuit 46 makes the transition of the signal SINT1 from the low level to the high level when the first signal STA makes the transition from the low level to the high level, or makes the transition of the signal SINT1 from the high level to the low level when the delay signal SDLY makes the transition from the low level to the high level. Thus, the signal SINT1 turns to the high level in the predetermined period. Due to this predetermined period, the integration period TP1 is set.

Figure 13:
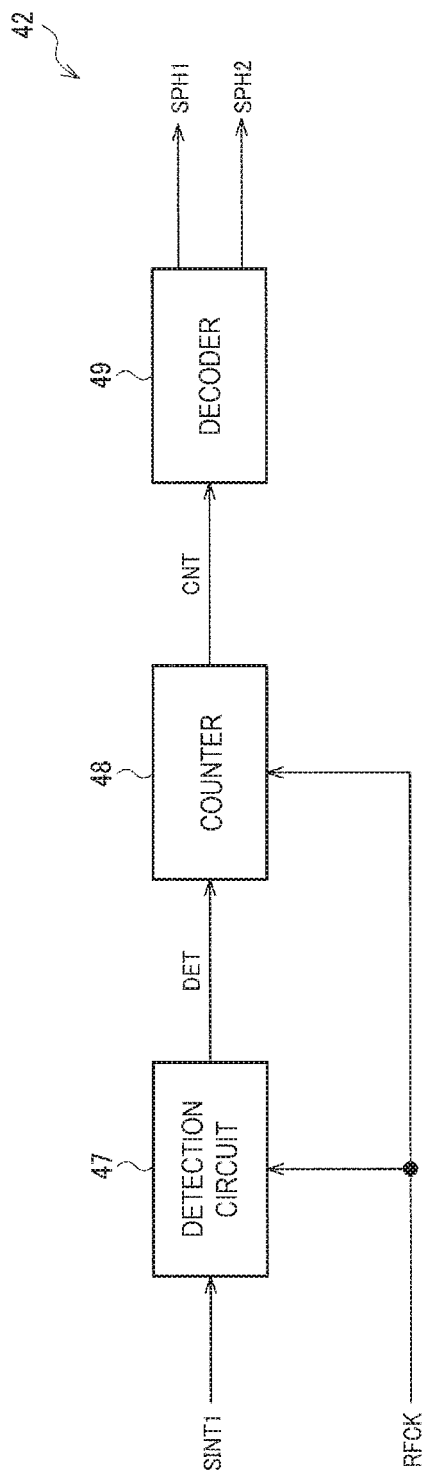
FIG. 13 is a diagram showing a detailed configuration example of a polarity switching signal generation circuit.

FIG. 13 shows a detailed configuration example of the polarity switching signal generation circuit. Here, although the description is presented citing the polarity switching signal generation circuit 42 as an example, the polarity switching signal generation circuit 44 also has substantially the same configuration. The polarity switching signal generation circuit 42 includes a detection circuit 47, a counter 48, and a decoder 49.

Figure 14:
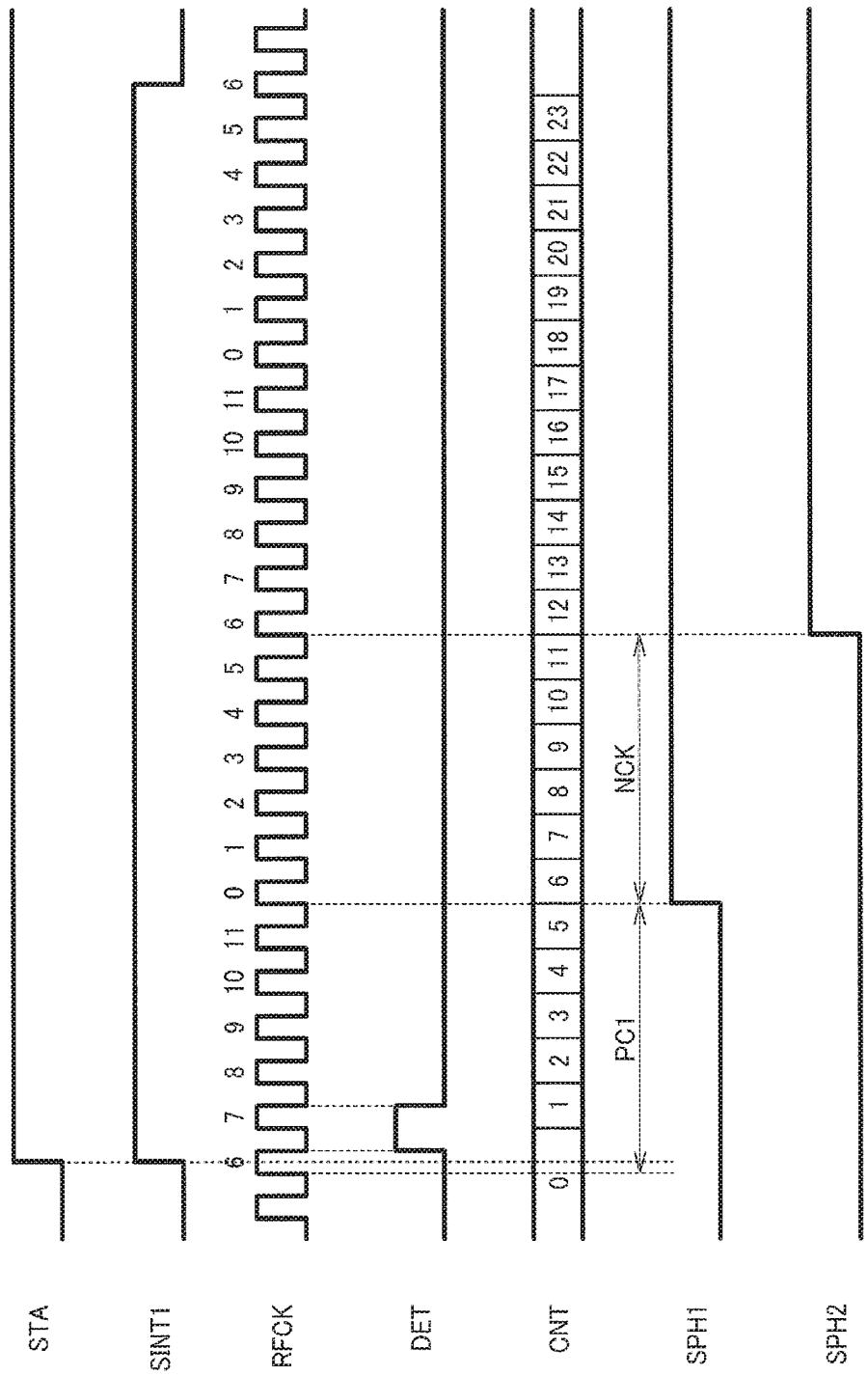
FIG. 14 is a waveform chart for explaining an operation of the polarity switching signal generation circuit.

FIG. 14 is a waveform chart for explaining the operation of the polarity switching signal generation circuit 42. The detection circuit 47 detects the first rising edge of the reference clock signal RFCK after the signal SINT1 makes the transition from the low level to the high level. When the detection circuit 47 detects the rising edge described above, the detection circuit 47 makes the transition of the detection signal DET from the low level to the high level.

The counter 48 starts a counting process at a rising edge of the detection signal DET. The counter 48 counts the clock count of the reference clock signal RFCK to output a count value CNT.

The decoder 49 decodes the count value CNT to thereby output the signals SPH1, SPH2. When the count value CNT coincides with the clock count PCI, the decoder 49 makes the transition of the signal SPH1 from the low level to the high level. In the example shown in FIG. 14, PCI=6 is assumed. When the count value CNT coincides with the clock count PCI+NCK, the decoder 49 makes the transition of the signal SPH2 from the low level to the high level. In the example shown in FIG. 14, NCK=6 is assumed.

3. Second Configuration Example

Figure 15:
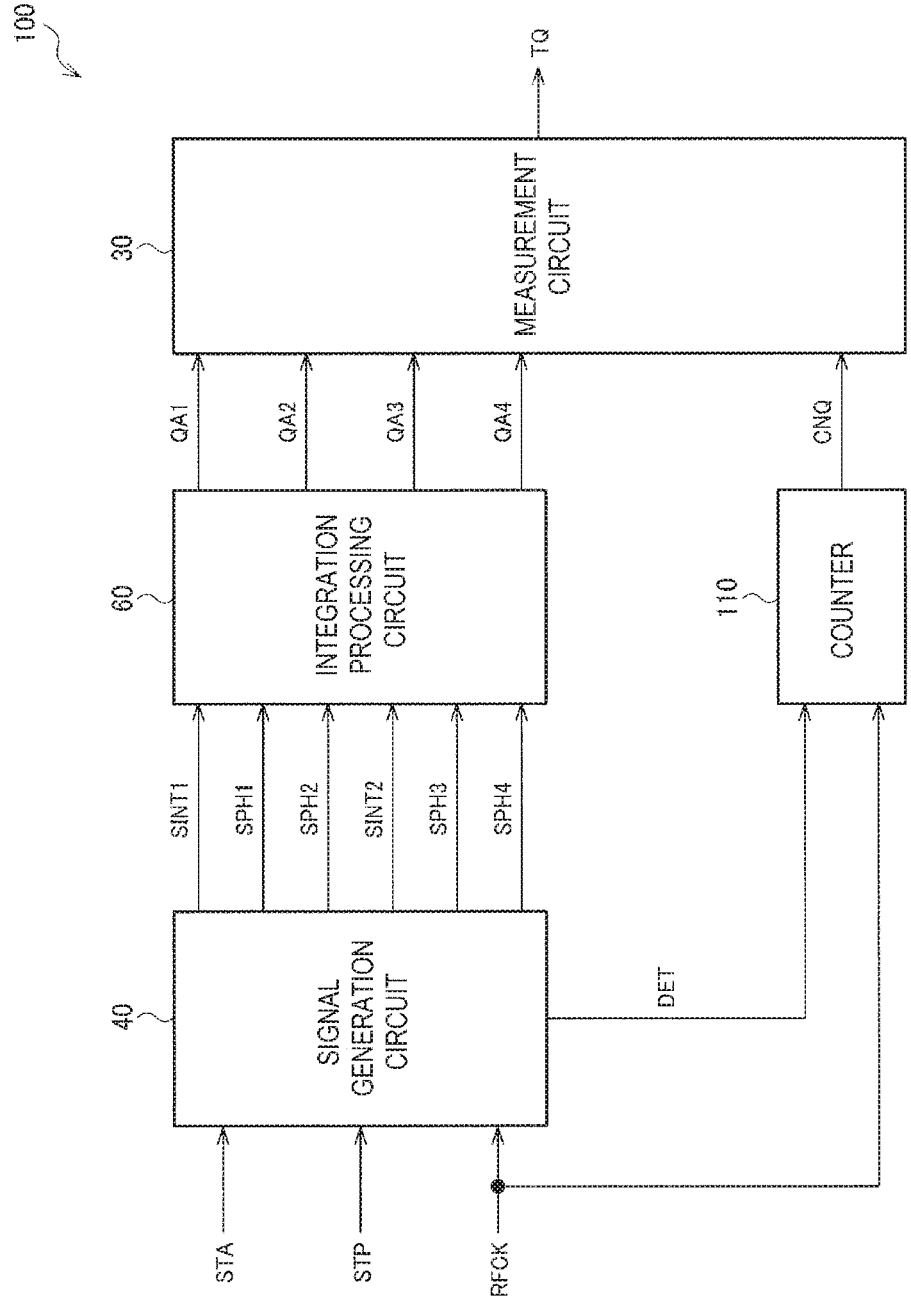
FIG. 15 is a diagram showing a second configuration example of the circuit device.

FIG. 15 shows a second configuration example of the circuit device 100. The circuit device 100 includes a counter 110, the signal generation circuit 40, the integration processing circuit 60, and the measurement circuit 30. It should be noted that the constituents having already been described are denoted by the same reference numerals, and the description of such constituents will arbitrarily be omitted.

The counter 110 performs the counting process based on the reference clock signal RFCK in a period from the transition timing of the signal SINT1 to the transition timing of the signal SINT2. The measurement circuit 30 obtains the digital value TQ representing the time difference TDF based on a count value CNQ output by the counter 110 and the voltages QA1 through QA4 output by the integration processing circuit 60.

Figure 16:
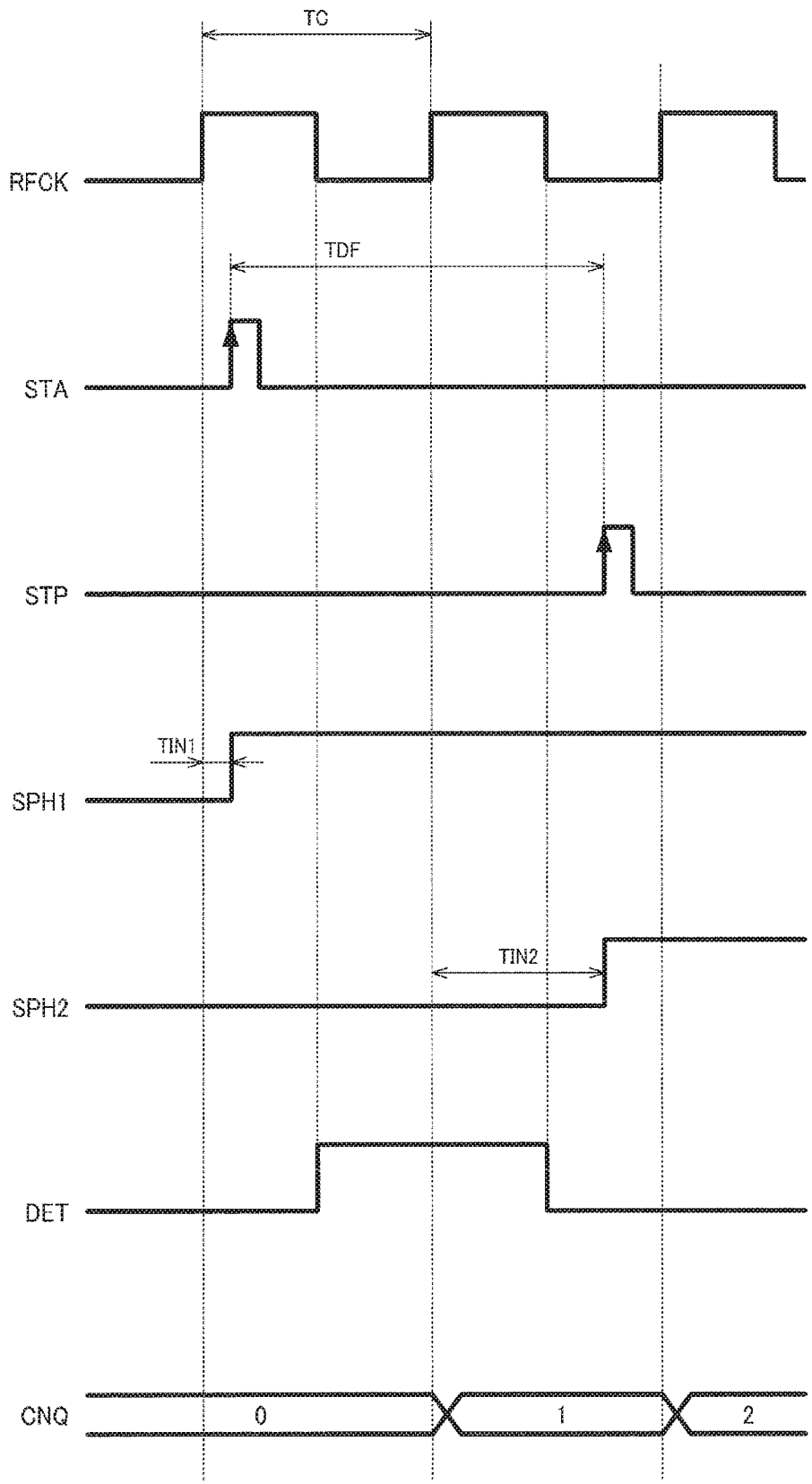
FIG. 16 is a waveform chart for explaining an operation of the circuit device as the second configuration example.

FIG. 16 is a waveform chart for explaining the operation of the circuit device 100 as the second configuration example. The counter 110 starts the counting process at a rising edge of the detection signal DET. The counter 110 counts the clock count of the reference clock signal RFCK to output the count value CNQ. As described with reference to FIG. 14, the detection signal DET makes the transition from the low level to the high level at the first rising edge of the reference clock signal RFCK after the signal SINT1 makes the transition from the low level to the high level. Therefore, the counter 110 performs the counting process from the transition timing of the signal SINT1 as a result.

The measurement circuit 30 holds the count value CNQ at the transition timing of the signal SINT2. The measurement circuit 30 obtains the digital value TQ based on the count value CNQ thus held and the voltages QA1 through QA4. Specifically, the measurement circuit 30 obtains the digital value TQ representing the time difference TDF based on the following formula (9).

$$TDF=TIN2-TIN1+CNQ \times TC \qquad (9)$$

The reference CNQ in the formula (9) described above is the count value CNQ at the transition timing of the signal SINT2. The method of obtaining TIN2−TIN1 is as described with reference to the formulas (1) through (8) described above.

Hereinafter, the measurement of TIN2−TIN1 is referred to as a fine measurement, and the measurement of CNQ×TC is referred to as a coarse measurement. In the present embodiment, as described with reference to FIG. 14 and FIG. 16, the fine measurement and the coarse measurement are started with the detection signal DET as a starting point. Thus, the fine measurement and the coarse measurement are performed based on the same edge of the reference clock signal RFCK as a result, and thus, the measurement error is reduced.

Specifically, when the transition timings of the first signal STA and the reference clock signal RFCK are close to each other, there can occur when the transition timing of the first signal STA is judged to be anterior to the transition timing of the reference clock signal RFCK, and when the transition timing of the first signal STA is judged to be posterior to the transition timing of the reference clock signal RFCK. When the control timings of the fine measurement and the coarse measurement are independent of each other, there is a possibility that, for example, the transition timing of the first signal STA is judged to be anterior to the transition timing of the reference clock signal RFCK in the fine measurement, and the transition timing of the first signal STA is judged to be posterior to the transition timing of the reference clock signal RFCK in the coarse measurement. In this case, there occurs the measurement error as much as one cycle of the reference clock signal RFCK as a result.

According to the present embodiment, since the fine measurement and the coarse measurement are performed based on the same edge of the reference clock signal RFCK, such a measurement error as described above does not occur. In the present embodiment, since the signals SPH1 through SPH4 for switching the integration polarity are generated inside the circuit device 100, it is made possible to perform the fine measurement based on the same edge as the edge of the reference clock signal RFCK used as the reference in the coarse measurement.

4. Third Configuration Example

Figure 17:
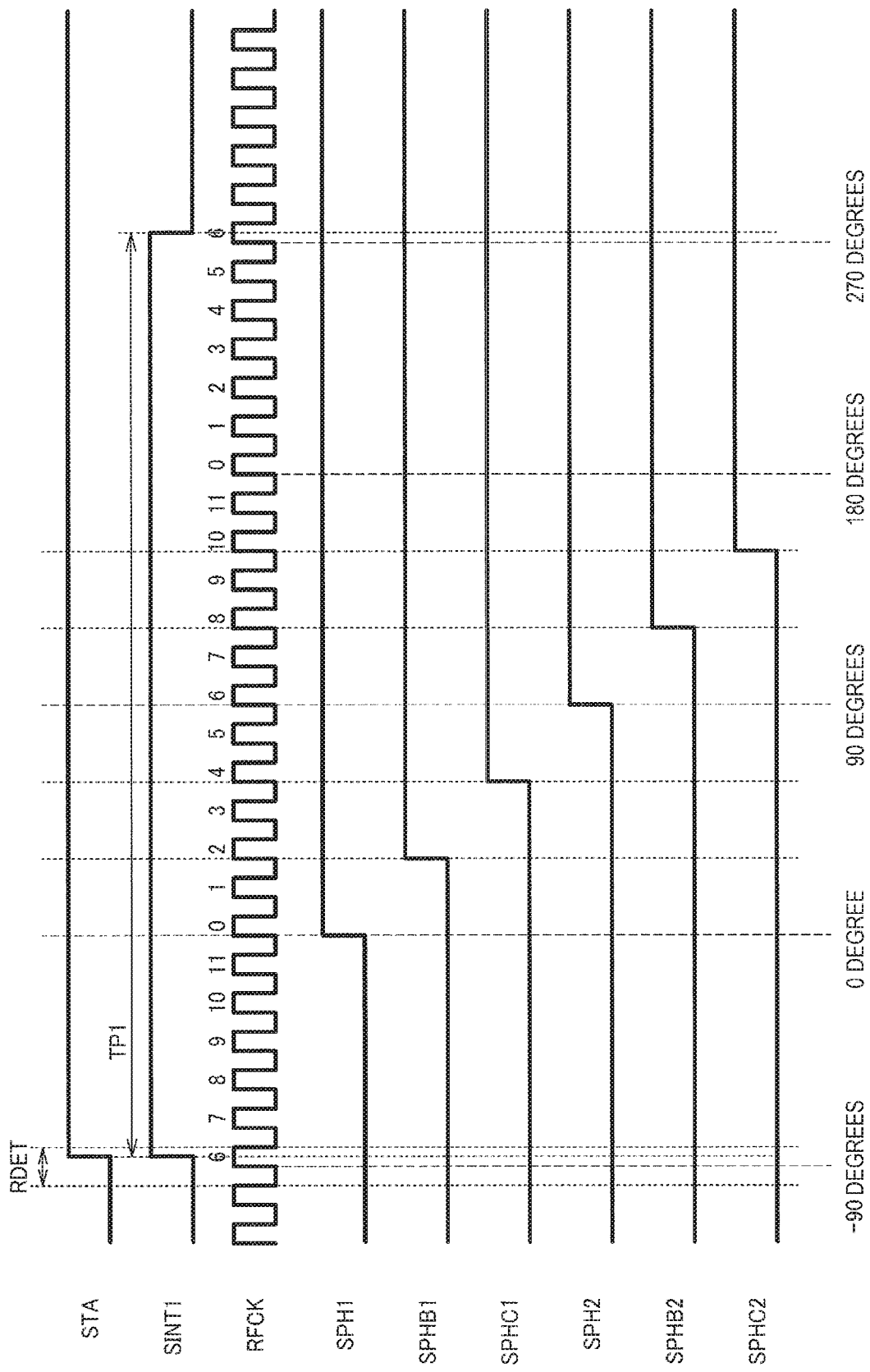
FIG. 17 is a waveform chart for explaining an operation of the circuit device as a third configuration example.

FIG. 17 is a waveform chart for explaining the operation of the circuit device 100 as a third configuration example. The signal generation circuit 40 generates signals SPH1, SPHB1, SPHC1, SPH2, SPHB2, and SPHC2 based on the signal SINT1 and the reference clock signal RFCK. The signal SPH1, SPHB1, SPHC1, SPH2, SPHB2, and SPHC2 are integration polarity switching signals making the transitions at the transition timings corresponding to 0 degree, 30 degrees, 60 degrees, 90 degrees, 120 degrees, and 150 degrees in phase, respectively.

The integration processing circuit 60 performs the integrating process based on the signals SINT1, SPH1 to output the voltage QA1 representing the integration value thereof, and performs the integrating process based on the signals SINT1, SPH2 to output the voltage QA2 representing the integration value thereof. The integration processing circuit 60 performs the integrating process based on the signals SINT1, SPHB1 to output the voltage QAB1 representing the integration value thereof, and performs the integrating process based on the signals SINT1, SPHB2 to output the voltage QAB2 representing the integration value thereof. The integration processing circuit 60 performs the integrating process based on the signals SINT1, SPHC1 to output the voltage QAC1 representing the integration value thereof, and performs the integrating process based on the signals SINT1, SPHC2 to output the voltage QAC2 representing the integration value thereof.

Figure 18:
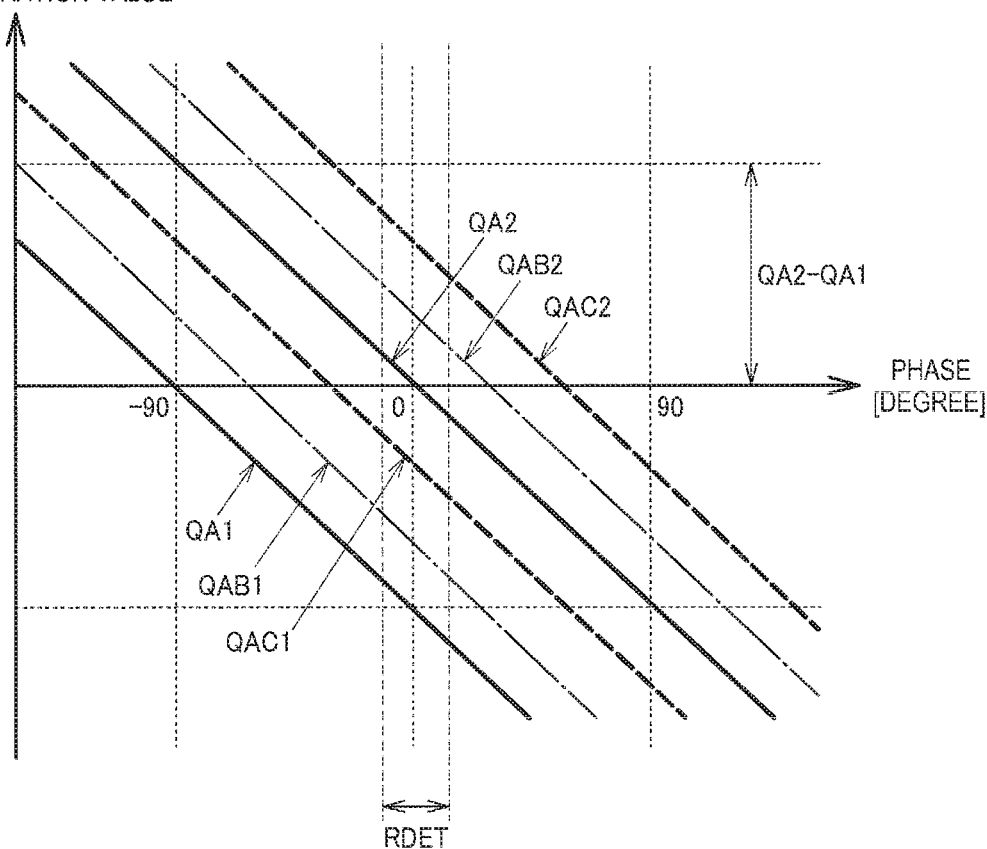
FIG. 18 is a characteristic diagram showing a relationship between the phase of the first signal and the integration values.

FIG. 18 is a characteristic diagram showing a relationship between the phase of the first signal STA and the integration values. As shown in FIG. 18, the voltages QAB1, QAC1, QA2, QAB2, and QAC2 have the characteristics having the phases shifted by 30 degrees with respect to the voltage QA1. The voltages QA1, QAB1, QAC1, QA2, QAB2, and QAC2 each have a linear characteristic with respect to the phase. The differences in amplitude between the integration values 90 degrees shifted in phase from each other satisfy QA2−QA1=QAB2−QAB1=QAC2−QAC1. These differences in amplitude are constant with respect to the phase, and have the same value.

Although the configuration and the operation for obtaining the integration values representing the phase of the first signal STA are hereinabove described, the configuration and the operation for obtaining the integration values representing the phase of the second signal STP are substantially the same.

The measurement circuit 30 obtains the first digital value based on the integration values obtained by the integration polarity switching signals at 0 degree and 90 degrees in phase, obtains the second digital value based on the integration values obtained by the integration polarity switching signals at 30 degrees and 120 degrees in phase, and obtains the third digital value based on the integration values obtained by the integration polarity switching signal at 60 degrees and 150 degrees in phase. Each of the first through third digital values represents the time difference TDF in transition timing between the first signal STA and the second signal STP. Regarding the integration values representing the phase of the first signal STA, the integration values obtained by the integration polarity switching signals at 0 degree and 90 degrees in phase are the voltages QA1, QA2, the integration values obtained by the integration polarity switching signals at 30 degrees and 120 degrees in phase are the voltages QAB1, QAB2, and the integration values obtained by the integration polarity switching signals at 60 degree and 150 degrees in phase are the voltages QAC1, QAC2. It should be noted that the integration values representing the phase of the second signal STP similar to these integration values are used for the calculation of the digital values.

According to the present embodiment, since the integrating process is performed based on the integration polarity switching signals shifted in phase by 30 degrees, the first through third digital values representing the time difference TDF can be obtained. Since the final digital value TQ is obtained based on the first through third digital values, the measurement accuracy increases.

5. Measurement Circuit, Integration Circuit

Figure 19:
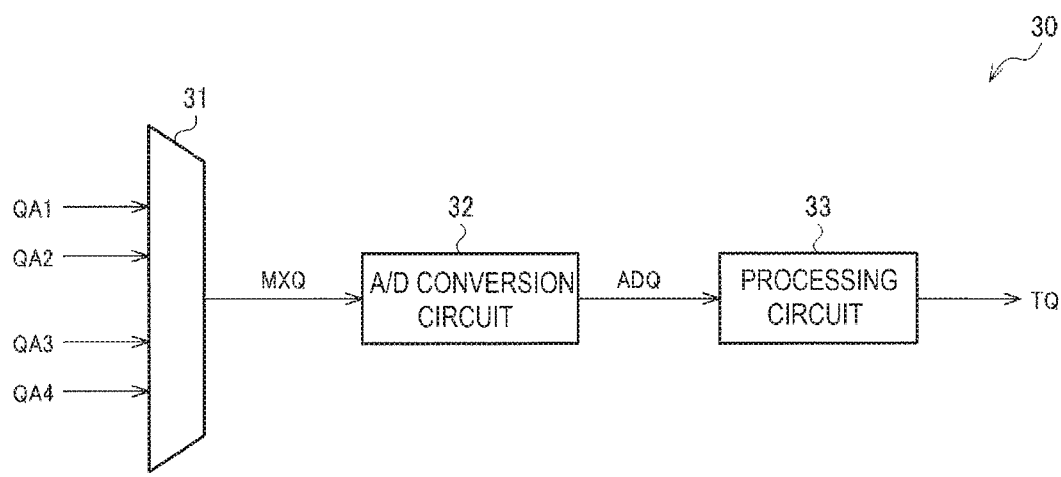
FIG. 19 is a diagram showing a detailed configuration example of a measurement circuit.

FIG. 19 shows a detailed configuration example of the measurement circuit 30. The measurement circuit 30 includes a selector 31, an A/D conversion circuit 32, and a processing circuit 33.

To the selector 31, there are input the voltages QA1 through QA4 from the integration processing circuit 60. The selector 31 selects these signals one by one in a time-sharing manner to output the signal thus selected as a signal MXQ. The A/D conversion circuit 32 performs the A/D conversion on the voltages QA1 through QA4 input as the signal MXQ in a time-sharing manner, and then outputs the result as data ADQ. The processing circuit 33 performs digital signal processing based on the data ADQ to obtain the digital value TQ representing the time difference TDF between the first signal STA and the second signal STP. The method of obtaining the digital value TQ is as described above.

Figure 20:
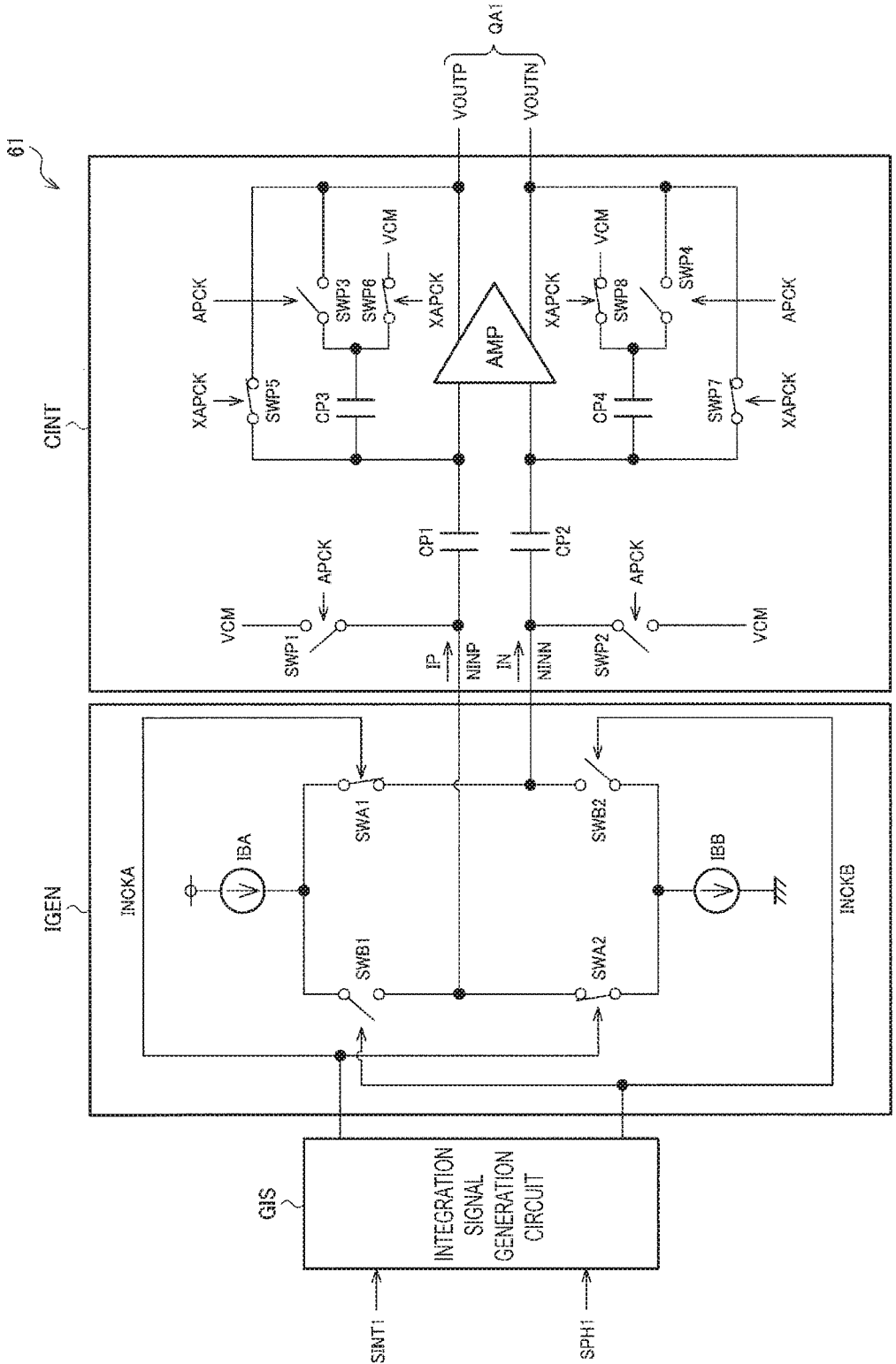
FIG. 20 is a diagram showing a detailed configuration example of the integration circuit.
Figure 21:
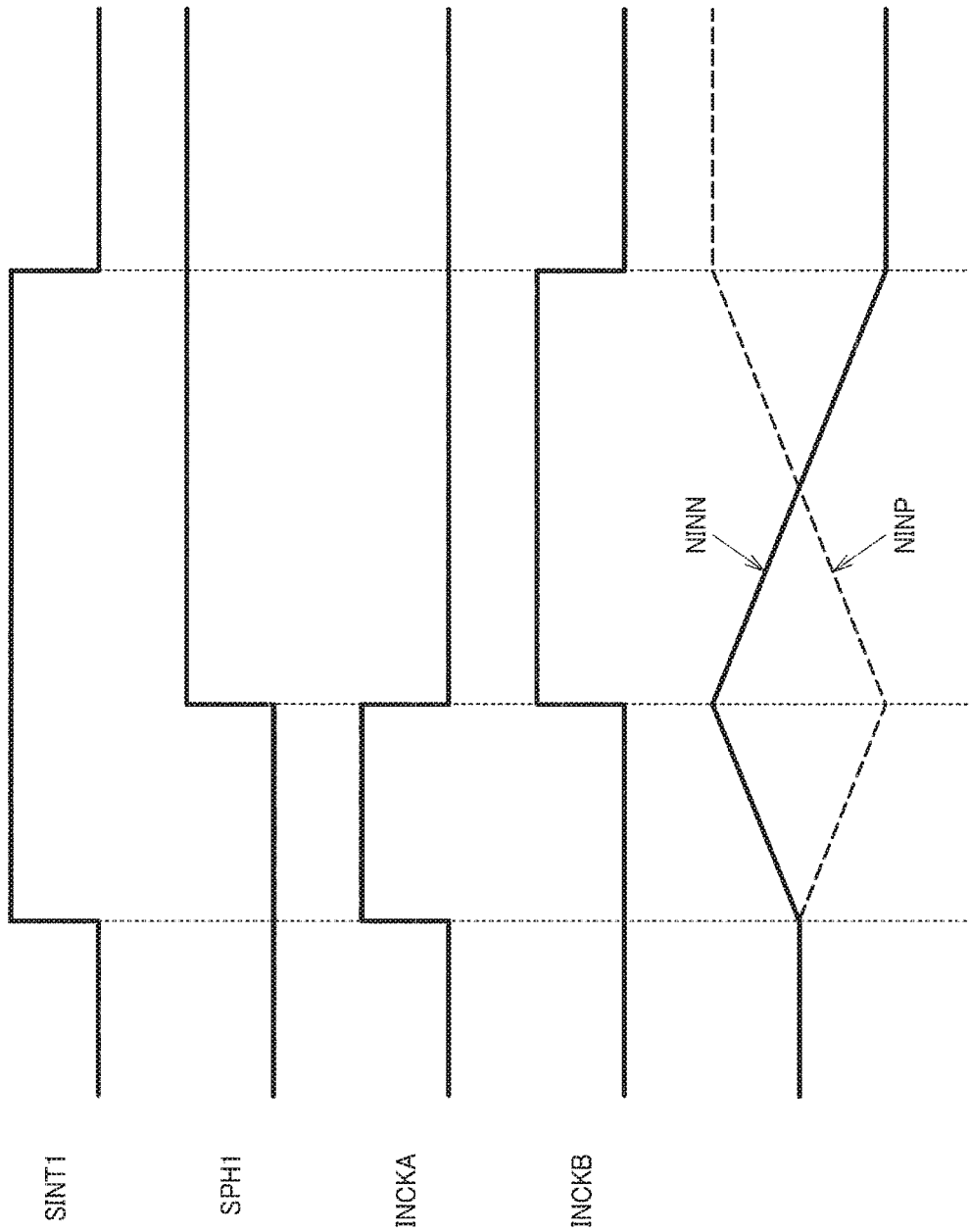
FIG. 21 is a waveform chart for explaining an operation of the integration circuit.

FIG. 20 shows a detailed configuration example of the integration circuit. Further, FIG. 21 is a waveform chart for explaining the operation of the integration circuit. It should be noted that although the description is presented here citing the integration circuit 61 as an example, the integration circuits 62 through 64 also have substantially the same configurations.

As shown in FIG. 20, the integration circuit 61 includes an integration signal generation circuit GIS, a current generation circuit IGEN, and a differential integration circuit CINT.

The integration signal generation circuit GIS generates integration signals INCKA, INCKB from the signal SINT1 and the signal SPH1. As shown in FIG. 21, the integration signal INCKA is a logical AND of the signal SINT1 and a logical NOT signal of the signal SPH1. The integration signal INCKB is a logical AND of the signal SINT1 and the signal SPH1.

The current generation circuit IGEN generates currents IP, IN based on the integration signals INCKA, INCKB to supply the currents IP, IN to input nodes NINP, NINN of the differential integration circuit CINT. Specifically, when the integration signal INCKA is in the high level, and the integration signal INCKB is in the low level, switch elements SWA1, SWA2 turn to the ON state, and switch elements SWB1, SWB2 turn to the OFF state. Then, a negative current having a constant current value is supplied from a current source IBB to the node NINP as the current IP, a positive current having a constant current value is supplied from a current source IBA to the node NINN as the current IN, and IP−IN<0 becomes true. In contrast, when the integration signal INCKA is in the low level, and the integration signal INCKB is in the high level, the switch elements SWA1, SWA2 turn to the OFF state, and the switch elements SWB1, SWB2 turn to the ON state. Then, a positive current having a constant current value is supplied from the current source IBA to the node NINP as the current IP, a negative current having a constant current value is supplied from the current source IBB to the node NINN as the current IN, and IP−IN>0 becomes true.

Hereinafter, the references NINN, NINP denote the voltages in the nodes NINN, NINP, respectively. The differential integration circuit CINT integrates the currents IP, IN input differentially, to output the integration value differentially as voltages VOUTP, VOUTN. In other words, the differential integration circuit CINT performs a charge-voltage conversion of converting the integration value of the charge supplied by the currents IP, IN into the voltages VOUTP, VOUTN. The differential integration circuit CINT performs inverting amplification of converting a negative input charge into a positive voltage. In other words, when the integration signal INCKA is in the high level, and the integration signal INCKB is in the low level, since IP−IN<0 is true as described above, the voltages NINP, NINN change in a direction in which the difference NINN−NINP between the voltages NINP, NINN increases as shown in FIG. 21. This process corresponds to the positive integration. In contrast, when the integration signal INCKA is in the low level, and the integration signal INCKB is in the high level, since IP−IN>0 is true as described above, the voltages NINP, NINN change in a direction in which the difference NINN−NINP decreases as shown in FIG. 21. This process corresponds to the negative integration.

It should be noted that the differential integration circuit CINT performs the integration operation and the inverting amplification operation based on control signals APCK, XAPCK. It should be noted that the control signal XAPCK is a logical NOT signal of the control signal APCK. Specifically, when the control signal APCK is in the low level, switch elements SWP1 through SWP4 turn to the OFF state, and switch elements SWP5 through SWP8 turn to the ON state. In this case, in capacitors CP1, CP2, nodes coupled to an amplifier circuit AMP are fixed to a common voltage of the amplifier circuit AMP, and the other nodes are set respectively to the voltages NINP, NINN corresponding to the integration values of the currents IP, IN input differentially, and thus, the capacitors CP1, CP2 perform the integration operation. It should be noted that capacitors CP3, CP4 are reset with the common voltage VCM. When the control signal APCK is in the high level, the switch elements SWP1 through SWP4 turn to the ON state, and the switch elements SWP5 through SWP8 turn to the OFF state. In this case, a differential integration circuit is constituted by the capacitors CP1 through CP4, and the amplifier circuit AMP, and the inverting amplification operation of converting the negative input charge into the positive voltage is performed as described above.

6. Physical Quantity Measurement Device, Electronic Apparatus, and Vehicle

Figure 22:
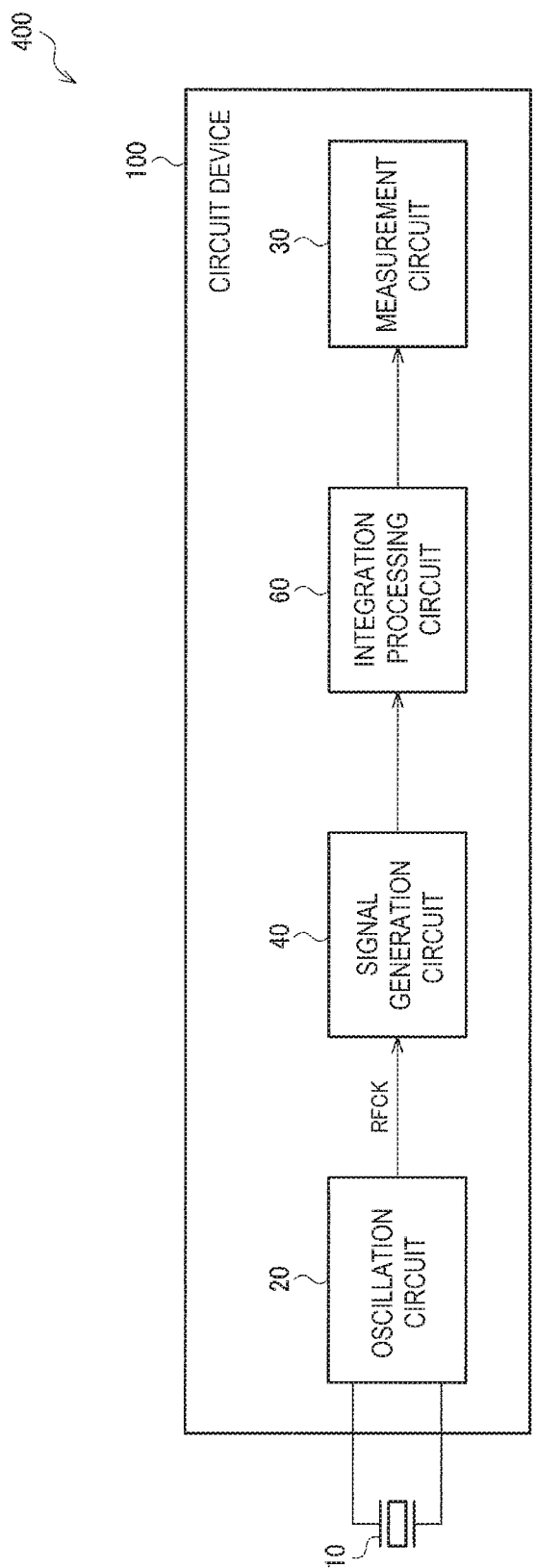
FIG. 22 is a diagram showing a configuration example of a physical quantity measurement device.

FIG. 22 shows a configuration example of a physical quantity measurement device 400 including the circuit device 100. The physical quantity measurement device 400 can be used for a ranging device for measuring a distance from an object as a physical quantity using, for example, a time-of-flight method. Alternatively, the physical quantity measurement device 400 can be used for an ultrasonograph which transmits an ultrasonic wave to an object and then receives the reflected wave to thereby measure the distance from the object as a physical quantity. In these examples, the time difference TDF in transition timing between the first signal STA and the second signal STP represents the distance from the object. It should be noted that the physical quantity measured by the physical quantity measurement device 400 is not limited to the time and the distance, but a variety of physical quantities such as a flow rate, flow speed, frequency, speed, acceleration, angular velocity, and angular acceleration are conceivable.

As shown in FIG. 22, the physical quantity measurement device 400 includes the circuit device 100 and a resonator 10. It is possible for the physical quantity measurement device 400 to include a package for housing the circuit device 100 and the resonator 10. The circuit device 100 includes an oscillation circuit 20, the signal generation circuit 40, the integration processing circuit 60, and the measurement circuit 30. The operations of the signal generation circuit 40, the integration processing circuit 60, and the measurement circuit 30 are as described with reference to FIG. 1 through FIG. 21.

The oscillation circuit 20 is electrically coupled to the resonator 10. Specifically, the circuit device 100 includes a first coupling terminal and a second coupling terminal, and an end of the resonator 10 and the oscillation circuit 20 are coupled to each other via the first coupling terminal, and the other end of the resonator 10 and the oscillation circuit 20 are coupled to each other via the second coupling terminal. It should be noted that the coupling in the present embodiment is electrical coupling. The electrical coupling means coupling capable of transmitting an electrical signal, and is coupling with which transmission of information by the electrical signal is achievable. The electrical coupling can also be coupling via a passive element, an active element, or the like.

The oscillation circuit 20 oscillates the resonator 10, and then generates the reference clock signal RFCK based on the oscillation signal. As the oscillation circuit 20, there can be used a variety of types of oscillation circuit such as a Pierce type, a Colpitts type, an inverter type, and a Hartley type.

The resonator 10 is an element for generating a mechanical vibration due to an electrical signal. The resonator 10 can be realized by a resonator element such as a quartz crystal resonator element. The resonator 10 can be realized by, for example, a quartz crystal resonator element vibrating in a thickness-shear mode having the cutting angle of AT-cut or SC-cut. It should be noted that the resonator 10 can be realized by a variety of resonator elements such as a resonator element other than the thickness-shear vibration type or a piezoelectric resonator element formed of a material other than the quartz crystal. For example, as the resonator 10, it is also possible to adopt a surface acoustic wave (SAW) resonator, an MEMS (micro electro-mechanical systems) resonator as a silicon resonator formed using a silicon substrate, and so on.

Figure 23:
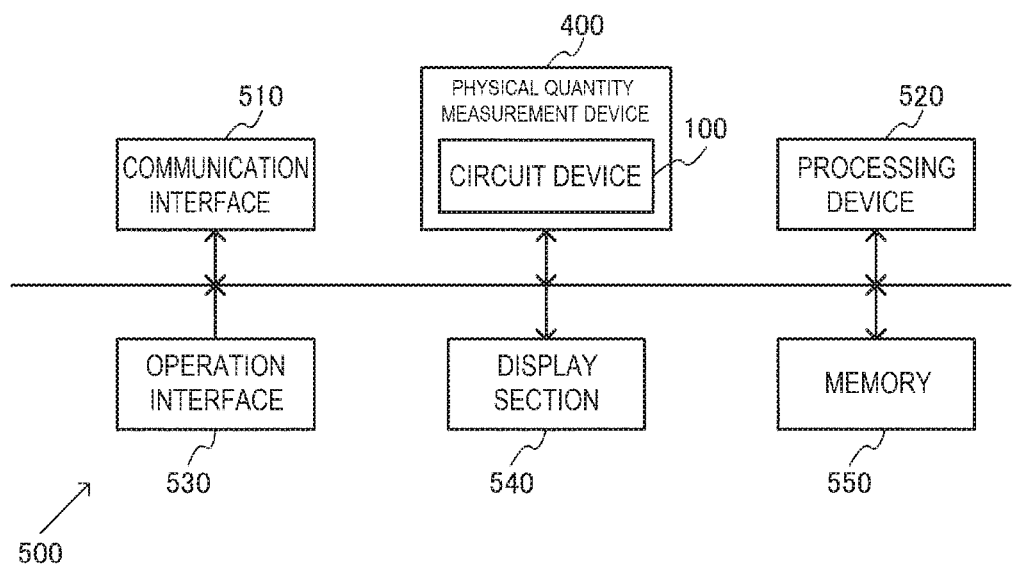
FIG. 23 is a diagram showing a configuration example of an electronic apparatus.

FIG. 23 shows a configuration example of an electronic apparatus 500 including the circuit device 100. The electronic apparatus 500 is, for example, a highly accurate measurement instrument for measuring a physical quantity such as a distance, time, flow speed, or a flow rate, a biological information measurement apparatus for measuring biological information, an in-car apparatus, or a robot. The biological information measurement apparatus is, for example, an ultrasonic measurement device. The in-car apparatus is an apparatus for automated driving, or the like.

As shown in FIG. 23, the electronic apparatus 500 includes the circuit device 100 and a processing device 520 for performing a process based on an output signal from the circuit device 100. The output signal can be a digital value as a measurement result of, for example, a time difference, or can also be a physical quantity other than the time obtained from the time difference. Specifically, the electronic apparatus 500 includes the physical quantity measurement device 400 having the circuit device 100, and the processing device 520 performs the process based on the physical quantity measured by the physical quantity measurement device 400. Further, the electronic apparatus 500 can include a communication interface 510, an operation interface 530, a display section 540, and a memory 550. It should be noted that the configuration of the electronic apparatus 500 is not limited to the configuration shown in FIG. 20, but it is possible to adopt a variety of modified implementations such as elimination of some of the constituents or addition of other constituents.

The communication interface 510 performs a process of receiving data from the outside and transmitting data to the outside. The processing device 520 as a processor performs a control process for the electronic apparatus 500, a variety of types of digital processing of the data transmitted or received via the communication interface 510, and so on. The function of the processing device 520 can be realized by a processor such as a microcomputer. The operation interface 530 is for the user to perform an input operation, and can be realized by operation buttons, a touch panel display, or the like. The display section 540 is for displaying a variety of types of information, and can be realized by a display using a liquid crystal, an organic EL, or the like. The memory 550 is for storing the data, and the function thereof can be realized by a semiconductor memory such as a RAM or a ROM.

Figure 24:
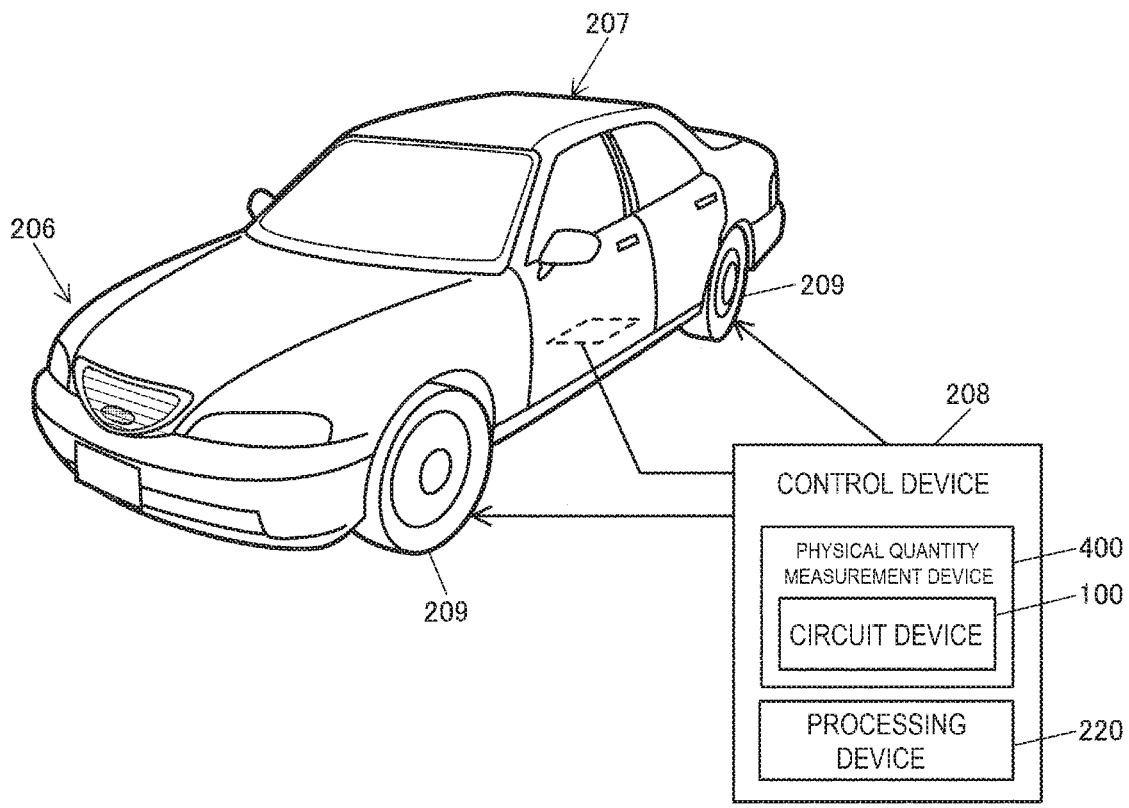
FIG. 24 is a diagram showing an example of a vehicle.

FIG. 24 shows an example of a vehicle including the circuit device 100. The vehicle includes the circuit device 100 and a processing device 220 for performing a process based on an output signal from the circuit device 100. The output signal can be a digital value as a measurement result of, for example, a time difference, or can also be a physical quantity other than the time obtained from the time difference. The circuit device 100 according to the present embodiment can be incorporated in a variety of vehicles such as a car, an airplane, a motorbike, a bicycle, a ship, or a boat. The vehicle is equipment or a device which is provided with a drive mechanism such as an engine or an electric motor, a steering mechanism such as a steering wheel or a helm, and a variety of electronic apparatuses, and moves on the ground, in the air, or on the sea.

FIG. 24 schematically shows a car 206 as a specific example of the vehicle. The car 206 incorporates the circuit device 100. Specifically, the car 206 as the vehicle includes a control device 208. The control device 208 includes the physical quantity measurement device 400 having the circuit device 100, and the processing device 220 for performing a process based on the physical quantity measured by the physical quantity measurement device 400. The control device 208 controls the stiffness of the suspension in accordance with, for example, the attitude of a car body 207, and controls the brake of each of the wheels 209. For example, it is also possible to realize automated driving of the car 206 using the control device 208. It should be noted that the apparatus incorporating the circuit device 100 is not limited to such a control device 208, but the circuit device 100 can be incorporated in a variety of types of in-car equipment such as meter panel equipment or navigation equipment provided to a vehicle such as the car 206.

The circuit device according to the present embodiment described hereinabove includes the integration period signal generation circuit, the polarity switching signal generation circuit, the first integration circuit, and the second integration circuit. The integration period signal generation circuit generates the first integration period signal. The first integration period signal is activated at the transition of the first signal, and is kept active in the first integration period having a predetermined period length longer than the period of the reference clock signal. The polarity switching signal generation circuit generates the first integration polarity switching signal and the second integration polarity switching signal. The first integration polarity switching signal makes the transition of the voltage level at a timing synchronized with the reference clock signal in the first integration period. The second integration polarity switching signal makes the transition of the voltage level a predetermined clock count of the reference clock signal after the transition timing of the first integration polarity switching signal in the first integration period. The first integration circuit performs the first integrating process in which the integration polarity is switched at the transition timing of the first integration polarity switching signal in the first integration period. The second integration circuit performs the second integrating process in which the integration polarity is switched at the transition timing of the second integration polarity switching signal in the first integration period.

According to the present embodiment, the polarity switching signal generation circuit generates the first integration polarity switching signal and the second integration polarity switching signal, the first integration circuit switches the integration polarity at the transition timing of the first integration polarity switching signal, and the second integration circuit switches the integration polarity at the transition timing of the second integration polarity switching signal. In other words, since the polarity switching signal generation circuit controls the switching timing of the integration polarity, it is possible to switch the integration polarity at an appropriate timing in the first integration period. Thus, since the periods for the positive integration and the negative integration are appropriately ensured, and therefore, the narrow pulse does not occur in the first and second integrating processes, the error in the time measurement is reduced.

Further, in the present embodiment, the circuit device can include the second integration period signal generation circuit, the second polarity switching signal generation circuit, a third integration circuit, a fourth integration circuit, and the measurement circuit. The second integration period signal generation circuit can generate the second integration period signal. The second integration period signal can be activated in the second integration period having a predetermined period length after the second signal makes the transition. The second polarity switching signal generation circuit can generate the third integration polarity switching signal and the fourth integration polarity switching signal. The third integration polarity switching signal can make the transition of the voltage level at a timing synchronized with the reference clock signal in the second integration period after the second signal makes the transition. The fourth integration polarity switching signal can make the transition of the voltage level a predetermined clock count of the reference clock signal after the transition of the third integration polarity switching signal in the second integration period. The third integration circuit can perform the third integrating process in which the integration polarity is switched at the transition timing of the third integration polarity switching signal. The fourth integration circuit can perform the fourth integrating process in which the integration polarity is switched at the transition timing of the fourth integration polarity switching signal. The measurement circuit can obtain the digital value corresponding to the time difference in transition timing between the first signal and the second signal based on the results of the first integrating process, the second integrating process, the third integrating process, and the fourth integrating process.

In this way, since the second polarity switching signal generation circuit controls the switching timing of the integration polarity, it is possible to switch the integration polarity at an appropriate timing in the second integration period. Thus, since the periods for the positive integration and the negative integration are appropriately ensured, and therefore, the narrow pulse does not occur in the third and fourth integrating processes, the error in the time measurement is reduced. Further, since the digital value corresponding to the time difference in transition timing between the first signal and the second signal is obtained based on the results of the first through fourth integrating processes, the accurate time difference is measured.

Further, in the present embodiment, the circuit device can include a counter. The counter can perform the counting process based on the reference clock signal in the period from the transition timing of the first integration period signal to the transition timing of the second integration period signal. The measurement circuit can obtain the digital value based on the count value of the counter, and the results of the first integrating process, the second integrating process, the third integrating process, and the fourth integrating process.

In the time measurement based on the results of the first through fourth integrating processes, a shorter time than one cycle of the reference clock signal can be measured. According to the present embodiment, since the counter is provided, the counter can measure the time difference in transition timing between the first signal and the second signal by one cycle of the reference clock signal. Thus, it is possible to expand the dynamic range of the time measurement to the longer dynamic range than one cycle of the reference clock signal.

Further, in the present embodiment, the predetermined period length can be no less than quadruple of the period of the reference clock signal.

In this way, it becomes possible to appropriately ensure the period of the positive integration and the period of the negative integration, and thus, the narrow pulse in which the period of the positive integration or the negative integration is short dose not occur. Thus, the error in the time measurement is reduced.

Further, in the present embodiment, the first integration period can be zoned by the transition timing of the first integration polarity switching signal into the first anterior half period and the first posterior half period. The first integration circuit can perform the first integrating process in the first polarity in the first anterior half period, and can perform the first integrating process in the second polarity as the opposite polarity to the first polarity in the first posterior half period. The second integration period can be zoned by the transition timing of the second integration polarity switching signal into the second anterior half period and the second posterior half period. The second integration circuit can perform the second integrating process in the first polarity in the second anterior half period, and can perform the second integrating process in the second polarity in the second posterior half period.

When the case in which the integrating process begins with the first polarity and the case in which the integrating process begins with the second polarity are mixed, the starting timing of the integration period and the transition timing of the integration polarity switching signal come close to each other in the vicinity of the switching of the starting polarity. Therefore, there is a possibility that the narrow pulse occurs. According to the present embodiment, since the integrating process inevitably begins with the integration in the first polarity, and ends with the integration in the second polarity, it is possible to make the starting timing of the integration period and the transition timing of the integration polarity switching signal appropriately away from each other. Thus, it is possible to prevent the narrow pulse from occurring.

Further, in the present embodiment, the integration period signal generation circuit can include the delay circuit and the signal output circuit. The delay circuit can output the delay signal making the transition after a predetermined period elapses from the transition of the first signal. The signal output circuit can change the first integration period signal from the inactive state to the active state when the first signal makes the transition, and can change the first integration period signal from the active state to the inactive state when the delay signal makes the transition.

In this way, it is possible for the integration period signal generation circuit to output the first integration period signal which is activated at the transition of the first signal, and is kept active in the first integration period having the predetermined period length longer than the period of the reference clock signal.

Further, in the present embodiment, the circuit device can include the oscillation circuit. The oscillation circuit can be electrically coupled to the resonator, and can oscillate the resonator to thereby output the reference clock signal.

In this way, the oscillation circuit oscillates the resonator to thereby generate the reference clock signal, and the polarity switching signal generation circuit can generate the first and second integration polarity switching signals based on the reference clock signal.

Further, the physical quantity measurement device according to the present embodiment includes the circuit device described above and the resonator.

Further, the electronic apparatus according to the present embodiment includes any one of the circuit devices described above, and the processing device which performs an operation based on the output signal from the circuit device.

Further, the vehicle according to the present embodiment includes any one of the circuit devices described above, and the processing device which performs an operation based on the output signal from the circuit device.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with the different term in any part of the specification or the accompanying drawings. Further, all of the combinations of the present embodiment and the modified examples are also included in the scope of the present disclosure. Further, the configurations and the operations of the circuit device, the physical quantity measurement device, the electronic apparatus, the vehicle, and so on are not limited to those described in the present embodiment, but can be implemented with a variety of modifications.

What is claimed is:

1. A circuit device comprising:
   an integration period signal generation circuit configured to generate a first integration period signal which turns to an active state at a transition of a first signal, and is kept in the active state in a first integration period having a predetermined period length longer than a period of a reference clock signal;
   a polarity switching signal generation circuit configured to generate a first integration polarity switching signal making a transition of a voltage level at a timing synchronized with the reference clock signal in the first integration period, and a second integration polarity switching signal making a transition of a voltage level a predetermined clock count of the reference clock signal after a transition timing of the first integration polarity switching signal in the first integration period;
   a first integration circuit configured to perform a first integrating process in which an integration polarity is switched at a transition timing of the first integration polarity switching signal in the first integration period; and
   a second integration circuit configured to perform a second integrating process in which an integration polarity is switched at a transition timing of the second integration polarity switching signal in the first integration period.

2. The circuit device according to claim 1 further comprising:
   a second integration period signal generation circuit configured to generate a second integration period signal which turns to the active state in a second integration period having the predetermined period length after a second signal makes a transition;
   a second polarity switching signal generation circuit configured to generate a third integration polarity switching signal making a transition of a voltage level at a timing synchronized with the reference clock signal in the second integration period after the second signal makes a transition, and a fourth integration polarity switching signal making a transition of a voltage level the predetermined clock count of the reference clock signal after a transition timing of the third integration polarity switching signal in the second integration period;

a third integration circuit configured to perform a third integrating process in which an integration polarity is switched at a transition timing of the third integration polarity switching signal;

a fourth integration circuit configured to perform a fourth integrating process in which an integration polarity is switched at a transition timing of the fourth integration polarity switching signal; and a measurement circuit configured to obtain a digital value corresponding to a time difference in transition timing between the first signal and the second signal based on results of the first integrating process, the second integrating process, the third integrating process, and the fourth integrating process.

3. The circuit device according to claim 2 further comprising:

a counter configured to perform a counting process based on the reference clock signal in a period from a transition timing of the first integration period signal to a transition timing of the second integration period signal, wherein the measurement circuit obtains the digital value based on a count value of the counter, and the results of the first integrating process, the second integrating process, the third integrating process, and the fourth integrating process.

4. The circuit device according to claim 1, wherein the predetermined period length is no less than quadruple of the period of the reference clock signal.

5. The circuit device according to claim 1, wherein the first integration period is zoned by a transition timing of the first integration polarity switching signal into a first anterior half period and a first posterior half period, the first integration circuit performs the first integrating process in a first polarity in the first anterior half period, and performs the first integrating process in a second polarity as an opposite polarity to the first polarity in the first posterior half period, the second integration period is zoned by a transition timing of the second integration polarity switching signal into a second anterior half period and a second posterior half period, and the second integration circuit performs the second integrating process in the first polarity in the second anterior half period, and performs the second integrating process in the second polarity in the second posterior half period.

6. The circuit device according to claim 1, wherein the integration period signal generation circuit includes a delay circuit configured to output a delay signal making a transition after the predetermined period elapses from the transition of the first signal, and a signal output circuit configured to change the first integration period signal from an inactive state to the active state when the first signal makes the transition, and change the first integration period signal from the active state to the inactive state when the delay signal makes the transition.

7. The circuit device according to claim 1 further comprising:

an oscillation circuit which is electrically coupled to a resonator and is configured to oscillate the resonator to thereby output the reference clock signal.

8. A physical quantity measurement device comprising:
the circuit device according to claim 7; and
the resonator.

9. An electronic apparatus comprising:
the circuit device according to claim 1; and
a processing device configured to execute a process based on an output signal from the circuit device.

10. A vehicle comprising:
the circuit device according to claim 1; and
a processing device configured to execute a process based on an output signal from the circuit device.

* * * * *